United States Patent
Jung et al.

(10) Patent No.: US 8,373,814 B2
(45) Date of Patent: Feb. 12, 2013

(54) DISPLAY PANEL AND DISPLAY PANEL DEVICE INCLUDING THE TRANSISTOR CONNECTED TO STORAGE CAPACITOR

(75) Inventors: Kwang-Chul Jung, Seongnam-si (KR); Young-Soo Yoon, Anyang-si (KR); Joon-Chul Goh, Hwaseong-si (KR); Chong-Chul Chai, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 313 days.

(21) Appl. No.: 12/833,695

(22) Filed: Jul. 9, 2010

(65) Prior Publication Data
US 2011/0013105 A1 Jan. 20, 2011

(30) Foreign Application Priority Data

Jul. 14, 2009 (KR) .................. 10-2009-0064177
Jun. 4, 2010 (KR) .................. 10-2010-0052876

(51) Int. Cl.
G02F 1/136 (2006.01)
G02F 1/1343 (2006.01)
G09G 3/36 (2006.01)
H01L 29/04 (2006.01)

(52) U.S. Cl. ............... 349/43; 349/38; 349/39; 349/42; 345/92; 257/59; 257/72

(58) Field of Classification Search ............ 349/42–43, 349/38–39; 345/92; 257/59, 72
See application file for complete search history.

(56) References Cited

U.S. PATENT DOCUMENTS

| 7,286,200 | B2 | 10/2007 | Inoue et al. | |
| 7,777,823 | B2 * | 8/2010 | Kim et al. | 349/48 |
| 7,940,346 | B2 * | 5/2011 | You et al. | 349/48 |
| 7,973,864 | B2 * | 7/2011 | Kim | 349/38 |
| 2008/0106660 | A1 | 5/2008 | Kitayama et al. | |
| 2008/0284931 | A1 | 11/2008 | Kimura | |
| 2009/0027324 | A1 | 1/2009 | Hsu et al. | |
| 2009/0303405 | A1 * | 12/2009 | Moon et al. | 349/39 |
| 2010/0020259 | A1 * | 1/2010 | Park et al. | 349/48 |
| 2010/0066934 | A1 * | 3/2010 | Kim et al. | 349/39 |

FOREIGN PATENT DOCUMENTS

| JP | 4104639 | 4/2008 |
| KR | 1020040105934 | 12/2004 |
| KR | 1020050018520 | 2/2005 |

* cited by examiner

Primary Examiner — Hoan C Nguyen
(74) Attorney, Agent, or Firm — H.C. Park & Associates, PLC

(57) ABSTRACT

An approach of a circuit configuration is provided for operating a display panel and a liquid crystal display with high aperture ratio, transmittance and visibility, the circuit configuration includes: a gate line; a data line intersecting the gate line; a first transistor connected to the gate line and the data line; a second transistor connected to the gate line and the data line; a storage electrode line separated from the gate line; a third transistor connected to the storage electrode line and the second transistor; a first pixel electrode connected to the first transistor; and a second pixel electrode connected to the second transistor and the third transistor. The third transistor being separated from an additional gate line is connected to the storage electrode line such that the aperture ratio can be increased, and visibility and transmittance can be enhanced.

20 Claims, 20 Drawing Sheets

DISPLAY PANEL AND DISPLAY PANEL DEVICE INCLUDING THE TRANSISTOR CONNECTED TO STORAGE CAPACITOR

CROSS-REFERENCE TO RELATED APPLICATION

This application claims priority to and the benefit of Korean Patent Application No. 10-2009-0064177 filed on Jul. 14, 2009 and Korean Patent Application No. 10-2010-0052876 filed on Jun. 4, 2010, which are herein incorporated by references for all purposes as if fully set forth herein.

BACKGROUND OF THE INVENTION

1. Field of the Invention

Exemplary embodiments of the present invention relate to a method and an apparatus for providing a circuit structure capable of driving a display panel, and more particularly, exemplary embodiments of the present invention relate to a method and an apparatus for providing an optimal circuit configuration to achieve a high aperture ratio, transmittance and visibility for a display panel that may be variously applied to a display applications, for example, liquid crystal display devices.

2. Description of the Related Art

As one of the most widely used flat panel displays (FPD), a liquid crystal display (LCD) may include two display panels in which field generating electrodes such as pixel electrodes and a common electrode may be disposed, and a liquid crystal layer may be interposed between the two display panels. Voltages can be applied to the field generating electrodes so as to generate an electric field over the liquid crystal layer, and the alignment of liquid crystal molecules of the liquid crystal layer is determined by applied electric field. Accordingly, the polarization of incident light can be controlled, thereby performing image display.

The LCD may also include switching elements connected to the respective pixel electrodes, and a plurality of signal lines such as gate lines and data lines may be disposed for controlling the switching elements and applying voltages to operate the pixel electrodes.

However, manufacturers of display devices are challenged to continually increasing complexity of a circuit configuration of the display devices (e.g., LCD) such as increasing a number of gate lines and the complicated configuration of the signal lines of the liquid crystal display, thereby the aperture ratio may be decreased and visibility and transmittance may be deteriorated.

The above information disclosed in this Background section is only to set up Applicant's recognition of problems within the existing art and merely for enhancement of understanding of the background of the invention based on the identified source of problems, and therefore the above information, which is the Applicant's own statement, cannot be used as prior art in determining obviousness into the present invention.

SUMMARY OF THE INVENTION

Exemplary embodiments of the present invention provide a method and an apparatus for providing a circuit configuration capable of increasing an aperture ratio, and achieving high visibility and transmittance of a display device.

Additional features of the invention will be set forth in the description which follows, and in part will be apparent from the description, or may be learned by practice of the invention.

Exemplary embodiments of the present invention disclose a display panel. The display panel includes a gate line and a data line which intersects the gate line. The display panel also includes a first transistor connected to the gate line and the data line. The display panel includes a second transistor connected to the gate line and the data line and a storage electrode line disposed being spaced apart from the gate line. The display panel includes a third transistor connected to the storage electrode line and the second transistor. The display panel also includes a first pixel electrode connected to the first transistor. And the display panel includes a second pixel electrode connected to the second transistor and the third transistor.

Exemplary embodiments of the present invention disclose a display device. The device includes a lower display panel comprising a gate line, a data line intersecting the gate line, a first transistor connected to the gate line and the data line, a second transistor connected to the gate line and the data line, a storage electrode line spaced apart from the gate line, a third transistor connected to the storage electrode line and the second transistor, a first pixel electrode connected to the first transistor, and a second pixel electrode connected to the second transistor and the third transistor. The device also includes a liquid crystal layer disposed on the lower display panel. The device includes an upper display panel disposed on the liquid crystal layer, the upper display panel comprising a common electrode.

Exemplary embodiments of the present invention disclose a method for providing a circuit layout for operating a display device. The method includes disposing a gate line and a data line intersecting the gate line on a substrate. The method also includes disposing a first pixel electrode and a second pixel electrode on the substrate. The method also includes forming a first transistor, a second transistor and a third transistor and each transistor comprising a gate electrode, a source electrode, and a drain electrode. The first transistor and the second transistor are coupled to the gate line and the data line and the first pixel electrode and the second pixel electrode coupled to the respective transistors. The method also includes forming a storage electrode line that is spaced apart from the gate line. The third transistor is separated from the gate line that is coupled to the storage electrode line and the second transistor. The first pixel electrode is coupled to the first transistor, and the second pixel electrode is coupled to the second transistor and the third transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
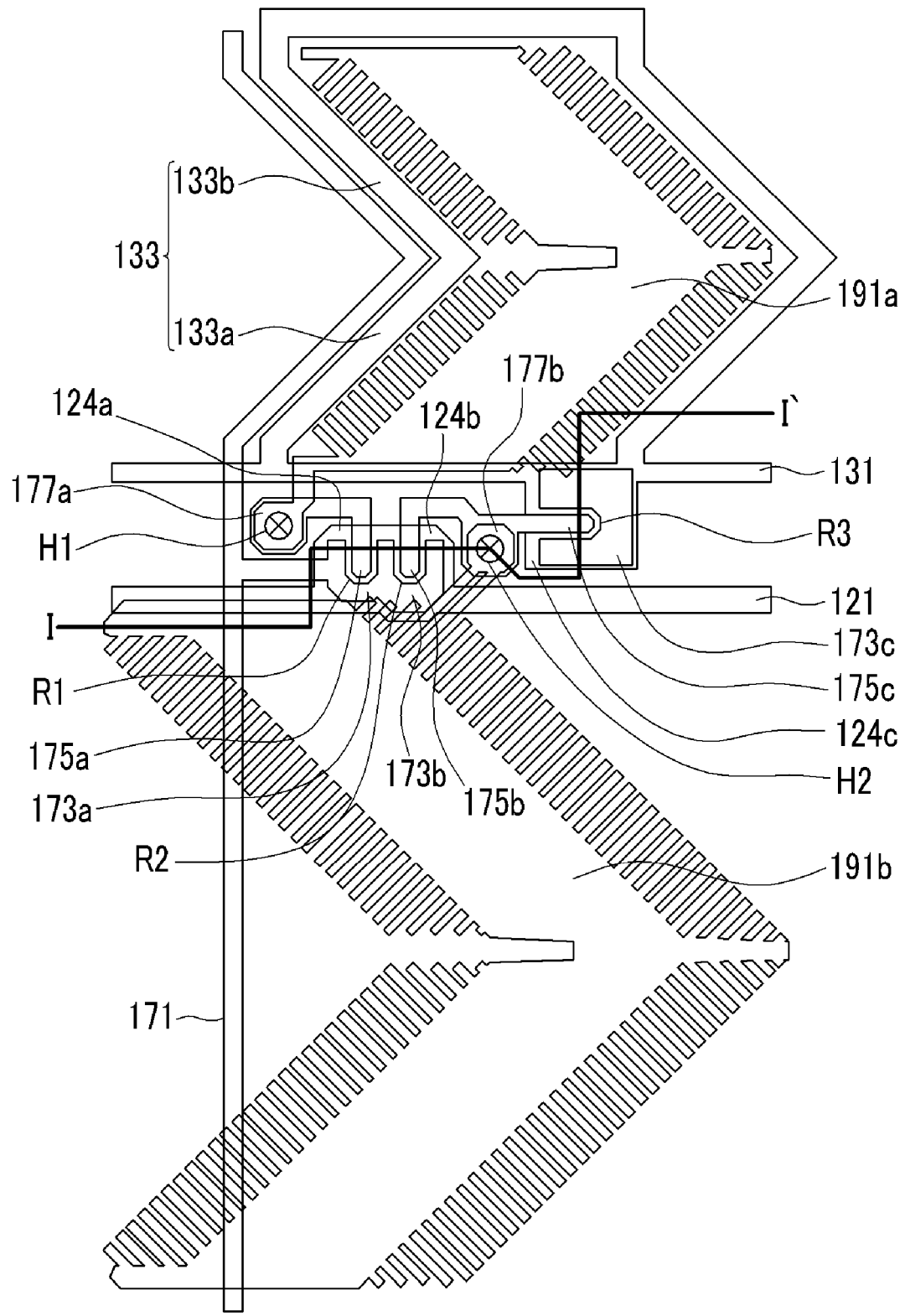
FIG. 1 is a top plan view of a liquid crystal display according to exemplary embodiments of the present invention.

Exemplary embodiments of the present invention provided for a display panel and a liquid crystal display including the display panel are described in detail with reference to the accompanying drawings. Advantages and features of the present invention can be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

Accordingly, in some specific embodiments, well known processing steps, devices or methods or redundant parts can be omitted in order to avoid unnecessarily obscuring the invention. Also exemplary embodiments of the present invention are illustrated by way of example, and not by way of limitation, for example: i) structural shapes, sizes, ratios, numbers, are schematically illustrated in the accompanying drawings such that they may be altered more or less, ii) the drawings are shown from the viewpoint of an observer such that the direction or location of explaining the drawings may be variously changed depending upon the position of the observer, iii) even when reference is made to different elements, like reference numerals may be used to designate those elements, iv) when the terms of "include," "have," "consist of," or the like are used, the relevant subject may include other parts unless the term "only" is used to define the contents thereof, v) when explanation is made by way of a singular term, it may be interpreted in a plural manner as well as in a singular manner, vi) even when the numerical values, shapes, size comparisons, positional relations are not explained with the adverb "about" or "substantially," they may be so interpreted to include the common error ranges, vii) even when the terms associated with sequence of time, for example, "after," "before," "and," "here," "subsequently," or the like are introduced, they may not meant to define temporal locations, viii) The terms indicating an order, for example, "the first," "the second," may be used only for convenience in distinction selectively, commutatively, or repeatedly, and may not meant to be read in any defined manners, and ix) it is understood that when an element is referred to as being "on," "over," "above," "below," or "beside" another element, it can be directly on the other element or one or more intervening elements may also be present.

It is understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
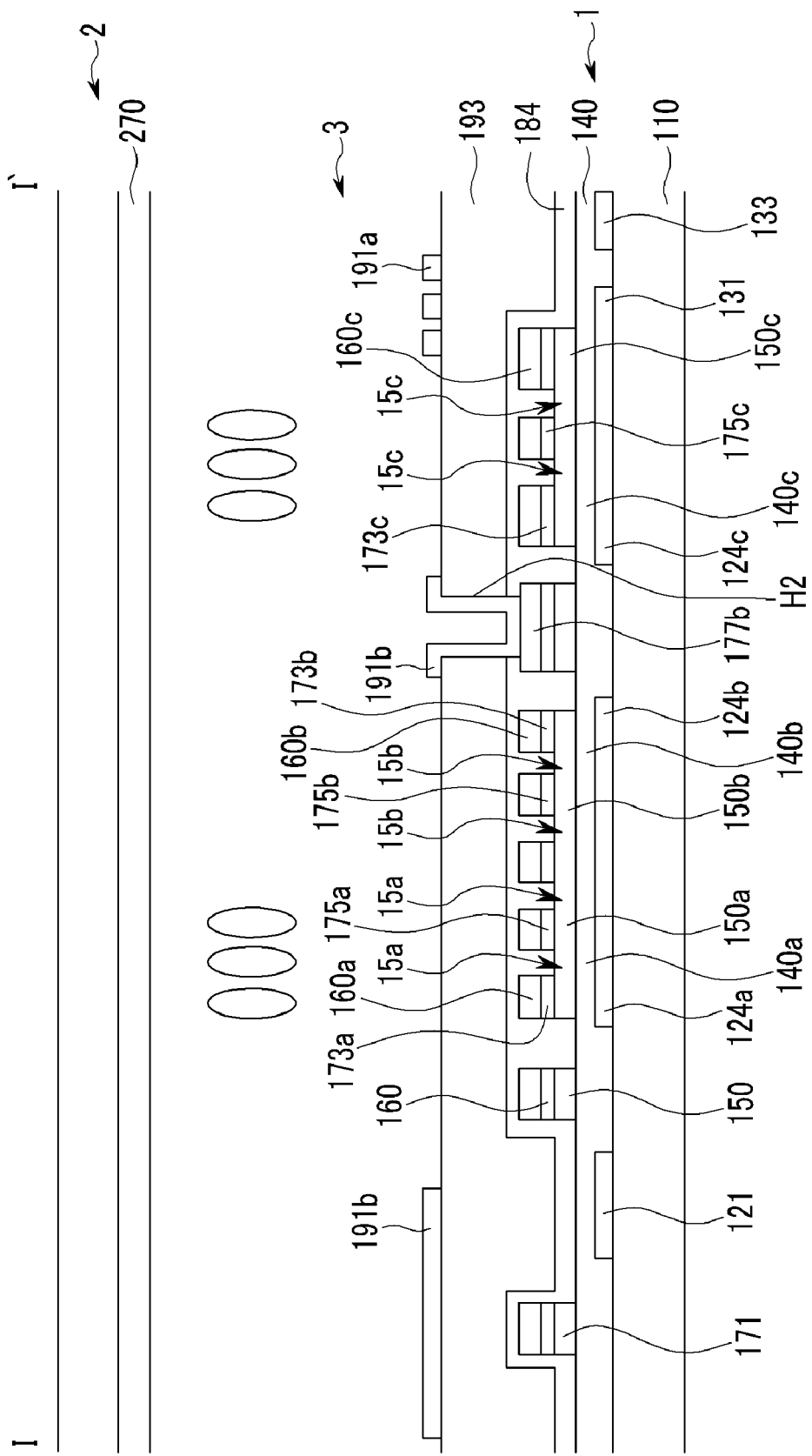
FIG. 2 is a cross-sectional view taken along the line I-I' of FIG. 1.

FIG. 1 is a top plan view of a liquid crystal display according to exemplary embodiments of the present invention. FIG. 2 is a cross-sectional view taken along the line I-I' of FIG. 1.

Referring to FIG. 1 and FIG. 2, a liquid crystal display includes a lower display panel 1, an upper display panel 2, and a liquid crystal layer 3 interposed between the lower display panel 1 and the upper display panel 2.

Referring to the lower display panel 1, a gate line 121, a first gate electrode 124a, a second gate electrode 124b, a storage electrode line 131, a storage electrode 133, and a third gate electrode 124c are disposed on a substrate 110. A light blocking member (not shown) may be disposed with the same layer as the gate line 121. The light blocking member may have a planar shape similar to the data line 171, may overlap the data line 171, or may have with a width that is substantially equal to or wider than the width of the data line 171. The light blocking member may electrically be isolated.

The gate line 121 and the storage electrode line 131 are disposed close to each other. Also, the gate line 121 and the storage electrode line 131 may substantially be extended parallel to each other.

The storage electrode 133 is connected to the storage electrode line 131, and may be extended in a direction away from the gate line 121. For example, one side of the storage electrode 133 may include a first portion 133a that is toward the inner portion of the pixel and is extended away from the gate line 121, and a second portion 133b that is connected to the first portion 133a and is extended away from the gate line 121 toward the outer portion of the pixel. Also, the storage electrode 133 may or may not have a closed-loop shape. In this example, the storage electrode 133 encloses the outer part of a first pixel electrode 191a thereby preventing light leakage.

The first gate electrode 124a and the second gate electrode 124b are integrally formed with the gate line 121. A portion having a wide width in the gate line 121 toward the storage electrode line 131 may be used as the first gate electrode 124a and the second gate electrode 124b. Also, the first gate electrode 124a and the second gate electrode 124b may be separated from each other.

The third gate electrode 124c is integrally formed with the storage electrode line 131. A portion having a wide width in the storage electrode line 131 toward the gate line 121 may be used as the third gate electrode 124c.

An insulating layer 140 covering the gate line 121, the first gate electrode 124a, the second gate electrode 124b, the storage electrode line 131, the storage electrode 133, and the third gate electrode 124c is formed on the substrate 110.

Here, portions of the insulating layer 140 that are disposed on the first gate electrode 124a, the second gate electrode 124b, and the third gate electrode 124c correspond to a first gate insulating layer 140a, a second gate insulating layer 140b, and a third gate insulating layer 140c.

A semiconductor layer pattern 150, an ohmic contact layer pattern 160, and a conductive layer pattern (referred to as 171, 173a, 173b, 173c, 175a, 175b, 175c, 177a, and 177b) are sequentially disposed on the insulating layer 140.

The conductive layer pattern (171, 173a, 173b, 173c, 175a, 175b, 175c, 177a, and 177b) includes a data line 171, a first source electrode 173a, a second source electrode 173b, a third source electrode 173c, a first drain electrode 175a, a second drain electrode 175b, a third drain electrode 175c, a first contact region 177a, and a second contact region 177b.

The data line 171 is extended in a direction crossing the storage electrode line 131 and the gate line 121, and has a shape extending according to the storage electrode 133 outside the storage electrode 133.

The first source electrode 173a is connected to the data line 171 and disposed on the first gate electrode 124a. The first source electrode 173a has a first recess R1 that is concave on the side. The first recess R1 may have a shape that is concave in the direction toward the gate line 121 from the storage electrode line 131.

The second source electrode 173b is connected to the first source electrode 173a and is disposed on the second gate electrode 124b. The second source electrode 173b may have substantially the same shape as the first source electrode 173a. That is, the side portion of the second source electrode 173b has a second recess R2 that is concave, and the second recess R2 may have a shape that is concave in the direction toward the gate line 121 from the storage electrode line 131.

For example, the first source electrode 173a and the second source electrode 173b may have a substantially similar to "∪" shape. Also, the structure in which the first source electrode 173a and the second source electrode 173b are connected to each other may have a substantially similar to "⊔⊔" shape.

The third source electrode 173c may be disposed on the third gate electrode 124c. The side portion of the third source electrode 173c may have a third recess R3 that is concave. Here, the third recess R3 may have a shape that is concave in the direction toward the third source electrode 173c from the second source electrode 173b. For example, the third source electrode 173c may have a substantially similar to "⊃" shape.

The first drain electrode 175a is inserted in the first recess R1 of the first source electrode 173a, and is separated from the first source electrode 173a with a predetermined interval. The second drain electrode 175b is inserted into the second recess R2 of the second source electrode 173b, and is separated from the second source electrode 173b with a predetermined interval. The third drain electrode 175c is inserted into the third recess R3 of the third source electrode 173c, and is separated from the third source electrode 173c with a predetermined interval.

The second drain electrode 175b and the third drain electrode 175c may integrally be formed to each other. Also, the second drain electrode 175b and the third drain electrode 175c may be connected to the second pixel electrode 191b through a single contact hole H2.

Also, the each shape of the source electrodes 173a, 173b, and 173c and the drain electrodes 175a, 175b, and 175c respectively is a bar shape and is disposed facing to each other. Further, shapes of the source electrodes 173a, 173b, and 173c and the drain electrodes 175a, 175b, and 175c may variously be changed based on a configuration.

The first contact region 177a is connected to the first drain electrode 175a. Also, the second contact region 177b is connected between the second drain electrode 175b and the third source electrode 173c. The first contact region 177a and the second contact region 177b may have a larger width than those of the first, second, and third drain electrodes 175a, 175b, and 175c.

The ohmic contact layer pattern 160 that is disposed under the conductive layer pattern 171, 173a, 173b, 173c, 175a, 175b, 175c, 177a, and 177b has substantially the same shape as the conductive layer pattern (171, 173a, 173b, 173c, 175a, 175b, 175c, 177a, and 177b).

Here, the portions that are disposed under the first source electrode 173a and the drain electrode 175a, the second source electrode 173b and the drain electrode 175b, and the third source electrode 173c and the drain electrode 175c among the ohmic contact layer pattern 160 respectively correspond to a first ohmic contact pattern 160a, a second ohmic contact pattern 160b, and a third ohmic contact pattern 160c.

The semiconductor layer pattern 150 is disposed under the ohmic contact layer pattern 160. The semiconductor layer pattern 150 has a different shape from the conductive layer pattern (171, 173a, 173b, 173c, 175a, 175b, 175c, 177a, and 177b), and the ohmic contact layer pattern 160.

The semiconductor layer pattern 150 includes a first portion 15a that is exposed between the first source electrode 173a and the first drain electrode 175a, a second portion 15b that is exposed between the second source electrode 173b and the second drain electrode 175b, and a third portion 15c that is exposed between the third source electrode 173c and the third drain electrode 175c.

The portions that are disposed on the first gate electrode 124a, the second gate electrode 124b, and the third gate electrode 124c among the semiconductor layer pattern 150 respectively correspond to a first semiconductor pattern 150a, a second semiconductor pattern 150b, and a third semiconductor pattern 150c.

However, when the semiconductor, the ohmic contact layer pattern, and the data line and the drain electrode are formed with different masks, the data line and the drain electrode may not have the same plane shape as the ohmic contact layer pattern, and the semiconductor may only be formed on the region overlapping the gate electrode.

A passivation layer 184 is formed on the above-described structure. An insulating layer 193 is formed on the passivation layer 184. According to exemplary embodiments of the present invention, at least one of a color filter (not shown) and a light blocking member (not shown) may be disposed between the passivation layer 184 and the insulating layer 193.

The insulating layer 193 and the passivation layer 184 have a first contact hole H1 and the second contact hole H2 respectively exposing the first contact region 177a and the second contact region 177b.

The first pixel electrode 191a that is connected to the first contact region 177a through the first contact hole H1 is disposed on the insulating layer 193. The first pixel electrode 191a may have a shape such that two electrode pieces of a parallelogram are symmetrically connected to each other with respect to the central line of the first pixel electrode 191a parallel to the storage electrode line. The boundary of the two electrode pieces may have a minute branch structure, the width of the minute branches may be in the range of about 2.0

μm-about 5.0 μm, and the distance between the minute branches may be in the range of about 2.0 μm-about 5.0 μm. Here, a cutout disposed between two electrode pieces and parallel to the gate line 121 may be omitted in order to avoid unnecessarily obscuring the invention. Also, the boundary of the first pixel electrode 191*a* may correspond to the boundary of the storage electrode 133.

Also, a second pixel electrode 191*b* that is connected to the second contact region 177*b* through the second contact hole H2 is disposed on the insulating layer 193. The second pixel electrode 191*b* may have a shape such that two electrode pieces of a parallelogram are symmetrically connected to each other with respect to the central line of the second pixel electrode 191*b* parallel to the storage electrode line.

Here, the area of the second pixel electrode 191*b* may be larger than the area of the first pixel electrode 191*a*. For example, the area of the second pixel electrode 191*b* may be about two times greater than the area of the first pixel electrode 191*a*. Also, the number of minute branches of the second pixel electrode 191*b* may be larger than the number of minute branches of the first pixel electrode 191*a*.

Referring to FIG. 2, the upper display panel 2 includes a common electrode 270. The liquid crystal layer 3 is disposed between the lower display panel 1 and the upper display panel 2.

Figure 15:
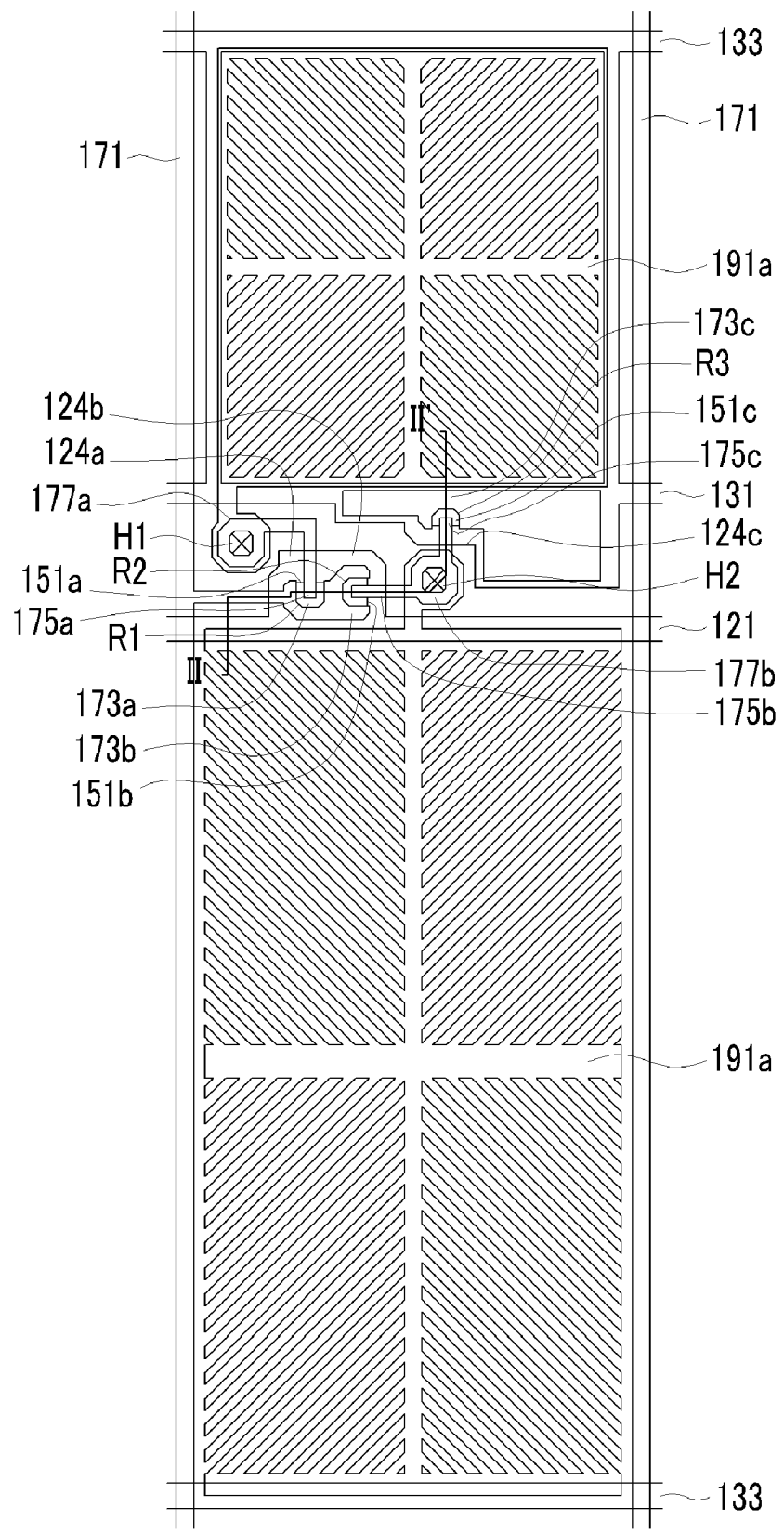
FIG. 15 is a top plan view of a liquid crystal display according to exemplary embodiments of the present invention.
Figure 16:
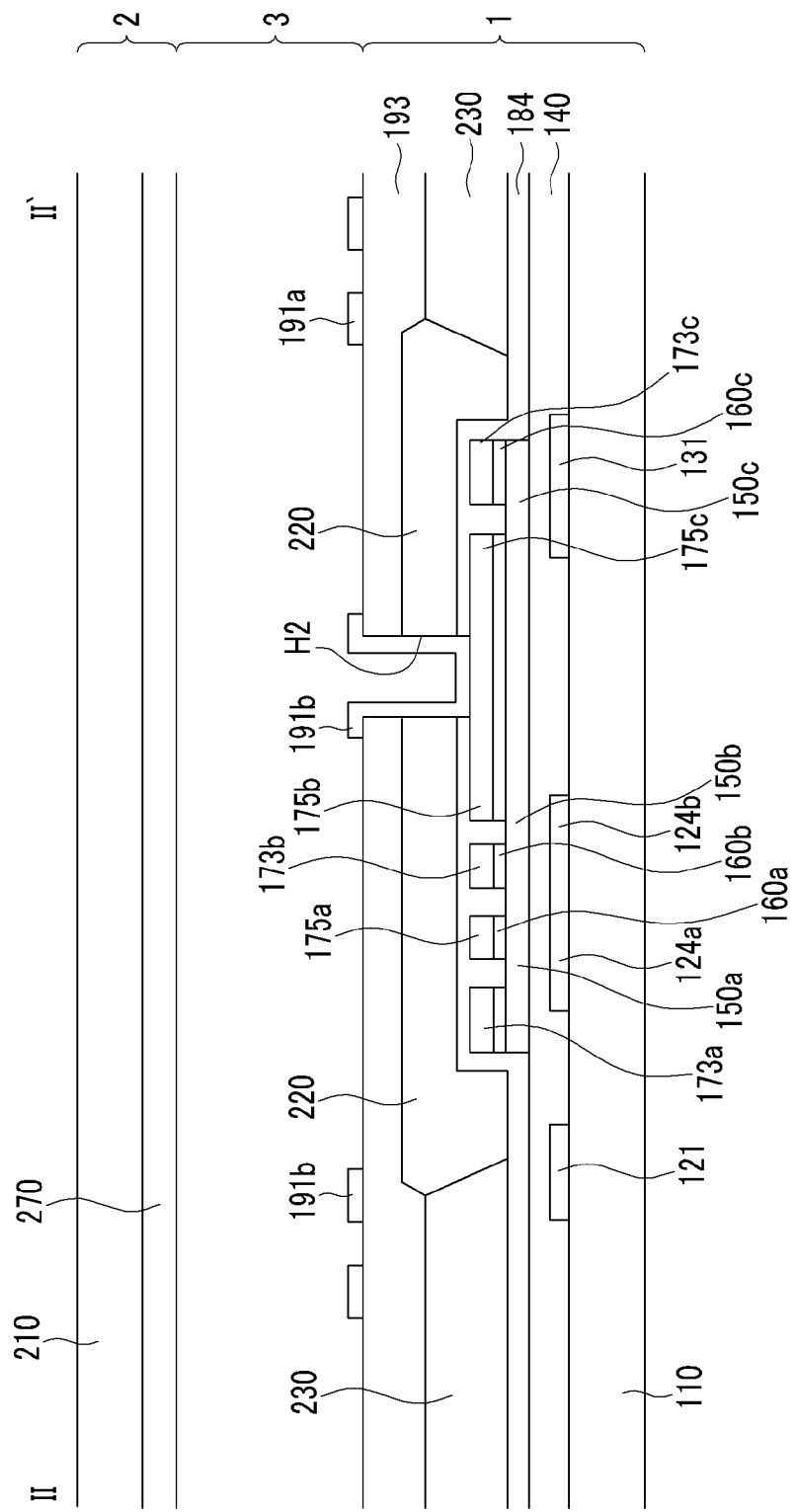
FIG. 16 is a cross-sectional view taken along the line II-II' of FIG. 15.

FIG. 15 is a top plan view of a liquid crystal display according to exemplary embodiments of the present invention. FIG. 16 is a cross-sectional view taken along the line II-II' of FIG. 15. The description overlapping the liquid crystal display of FIG. 1 and FIG. 2 is omitted in order to avoid unnecessarily obscuring the invention.

The storage electrode 133 is connected to the storage electrode line 131 and has a closed-loop shape enclosing the pixel electrode 191*a*.

The data line 171 extends in an approximately vertical direction.

The first source electrode 173*a* is connected to the data line 171 and disposed on the first gate electrode 124*a*. The first source electrode 173*a* may have the first recess R1 that is concave on the side. The first recess R1 may have a shape that is concave in the direction toward the gate line 121 from the storage electrode line 131. For example, the first source electrode 173*a* may have substantially similar to "U" shape.

The second source electrode 173*b* is connected to the first source electrode 173*a* and is disposed on the second gate electrode 124*b*. The second source electrode 173*b* may have a second recess R2 that is concave. The second recess R2 may have a shape that is concave in the direction toward the first source electrode 173*a* from the second drain electrode 175*b*. For example, the first source electrode 173*a* may have a substantially similar to " ⊂ " shape.

For example, the first source electrode 173*a* and the second source electrode 173*b* may be connected to each other. The first gate electrode 124*a* and the second gate electrode 124*b* may be connected to each other.

The third source electrode 173*c* may be disposed on the third gate electrode 124*c*. The third gate electrode 124*c* is connected to the storage electrode line 131. The third source electrode 173*c* may have a third recess R3 that is concave. Here, the third recess R3 may have a shape that is concave in the direction toward the storage electrode line 131 from the gate line 121. For example, the third source electrode 173*c* may have a substantially similar to "∩" shape. Also, both sides of the third recess R3 of the third source electrode 173*c* may be extended into a rectangular shape, thereby the third source electrode 173*c* may form a capacitor along with the third gate electrode 124*c*.

The first drain electrode 175*a* is inserted into the first recess R1 of the first source electrode 173*a*, and is separated from the first source electrode 173*a* with a predetermined interval. The second drain electrode 175*b* is inserted into the second recess R2 of the second source electrode 173*b*, and is separated from the second source electrode 173*b* with a predetermined interval. The third drain electrode 175*c* is inserted into the third recess R3 of the third source electrode 173*c*, and is separated from the third source electrode 173*c* with a predetermined interval.

The second drain electrode 175*b* and the third drain electrode 175*c* may integrally be formed to each other. Also, the second drain electrode 175*b* and the third drain electrode 175*c* may be connected to the second pixel electrode 191*b* through a single contact hole H2.

Also, the source electrodes 173*a*, 173*b*, and 173*c* and the drain electrodes 175*a*, 175*b*, and 175*c* respectively has a bar-shaped electrode and is disposed facing to each other. Further, shapes of the source electrodes 173*a*, 173*b*, and 173*c* and the drain electrodes 175*a*, 175*b*, and 175*c* may variously be changed based on a configuration.

The first contact region 177*a* is connected to the first drain electrode 175*a*. Also, the second contact region 177*b* is connected between the second drain electrode 175*b* and the third source electrode 173*c*. The first contact region 177*a* and the second contact region 177*b* have a larger width than the first, second, and third drain electrodes 175*a*, 175*b*, and 175*c*.

The ohmic contact layer pattern 160 that is disposed under the conductive layer pattern (171, 173*a*, 173*b*, 173*c*, 175*a*, 175*b*, 175*c*, 177*a*, and 177*b*) has the substantially same as the conductive layer pattern (171, 173*a*, 173*b*, 173*c*, 175*a*, 175*b*, 175*c*, 177*a*, and 177*b*).

Here, portions that are disposed under the first source and drain electrodes 173*a* and 175*a*, the second source and drain electrodes 173*b* and 175*b*, and the third source and drain electrodes 173*c* and 175*c* among the ohmic contact layer pattern 160 respectively correspond to the first ohmic contact pattern 160*a*, the second ohmic contact pattern 160*b*, and the third ohmic contact pattern 160*c*.

The semiconductor layer pattern 150 is disposed under the ohmic contact layer pattern 160. The semiconductor layer pattern 150 has a different shape from the conductive layer pattern (171, 173*a*, 173*b*, 173*c*, 175*a*, 175*b*, 175*c*, 177*a*, and 177*b*), and the ohmic contact layer pattern 160.

The semiconductor layer pattern 150 includes the first portion 15*a* that is exposed between the first source electrode 173*a* and the first drain electrode 175*a*, the second portion 15*b* that is exposed between the second source electrode 173*b* and the second drain electrode 175*b*, and the third portion 15*c* that is exposed between the third source electrode 173*c* and the third drain electrode 175*c*.

The portions that are disposed on the first gate electrode 124*a*, the second gate electrode 124*b*, and the third gate electrode 124*c* among the semiconductor layer pattern 150 respectively correspond to the first semiconductor pattern 150*a*, the second semiconductor pattern 150*b*, and the third semiconductor pattern 150*c*.

A passivation layer 184 is formed on the above-described structure. An insulating layer 193 is formed on the passivation layer 184. At least one of the passivation layer 184 and the insulating layer 192 may be omitted. According to exemplary embodiments of the present invention, a color filter 230 may be disposed between the passivation layer 184 and the insulating layer 193. A light blocking member 220 may be disposed between the passivation layer 184 and the insulating layer 193. The light blocking member 220 may be disposed between several color filters 230, and may cover the edges of the color filters 230. For example, the color filters 230 and the light blocking member 220 may all be in the lower display panel 1, or may all be disposed in the upper display panel 2. Also, one of the color filter 230 and the light blocking member 220 may be disposed in the lower display panel 1, and may alternatively be disposed in the upper display panel 2.

The insulating layer 193 and the passivation layer 184 have the first contact hole H1 and the second contact hole H2 respectively exposing the first contact region 177a and the second contact region 177b.

The first pixel electrode 191a that is connected to the first contact region 177a through the first contact hole H1 is disposed on the insulating layer 193.

The overall shape of the first pixel electrode 191a is an approximate quadrangle, and may include a crossed stem having a transverse stem and a longitudinal stem, an outer stem enclosing the outer part of the crossed stem, and a protrusion protruded downward from the lower portion of the longitudinal stem of the crossed stem. Here, the outer stem may enclose the entire outer part of the crossed stem, or a portion thereof.

The overall shape of the second pixel electrode 191b is an approximate quadrangle, and may include a crossed stem having a transverse stem and a longitudinal stem, an upper transverse portion and a lower transverse portion, and a protrusion protruded upward from the upper portion of the longitudinal stem of the crossed stem.

The first pixel electrode 191a and the second pixel electrode 191b are respectively divided into four sub-regions by the crossed stem. The first pixel electrodes 191a and the second pixel electrode 191b include a plurality of minute branches obliquely extending outward from the crossed stem in each sub-region, and a minute slit is formed between the minute branches. The width of the minute branches may be in the range about 2.0 μm-about 5.0 μm, and the interval between the minute branches may be in the range about 2.0 μm-about 5.0 μm.

An alignment layer (not shown) may be formed on the first pixel electrodes 191a and the second pixel electrode 191b and the insulating layer 193.

In exemplary embodiments of the present invention, the first pixel electrodes 191a and the second pixel electrode 191b include four sub-regions that have different length directions of the minute branches or the minute slits such that the inclination direction of the liquid crystal molecules of the liquid crystal layer 3 are a total of four directions. The reference viewing angle of the liquid crystal display may be increased by varying the inclination directions of the liquid crystal molecules.

Here, the area of the second pixel electrode 191b may be larger than the area of the first pixel electrode 191a. For example, the area of the second pixel electrode 191b may be in the range of about 1-3 times greater than the area of the first pixel electrode 191a.

Figure 18:
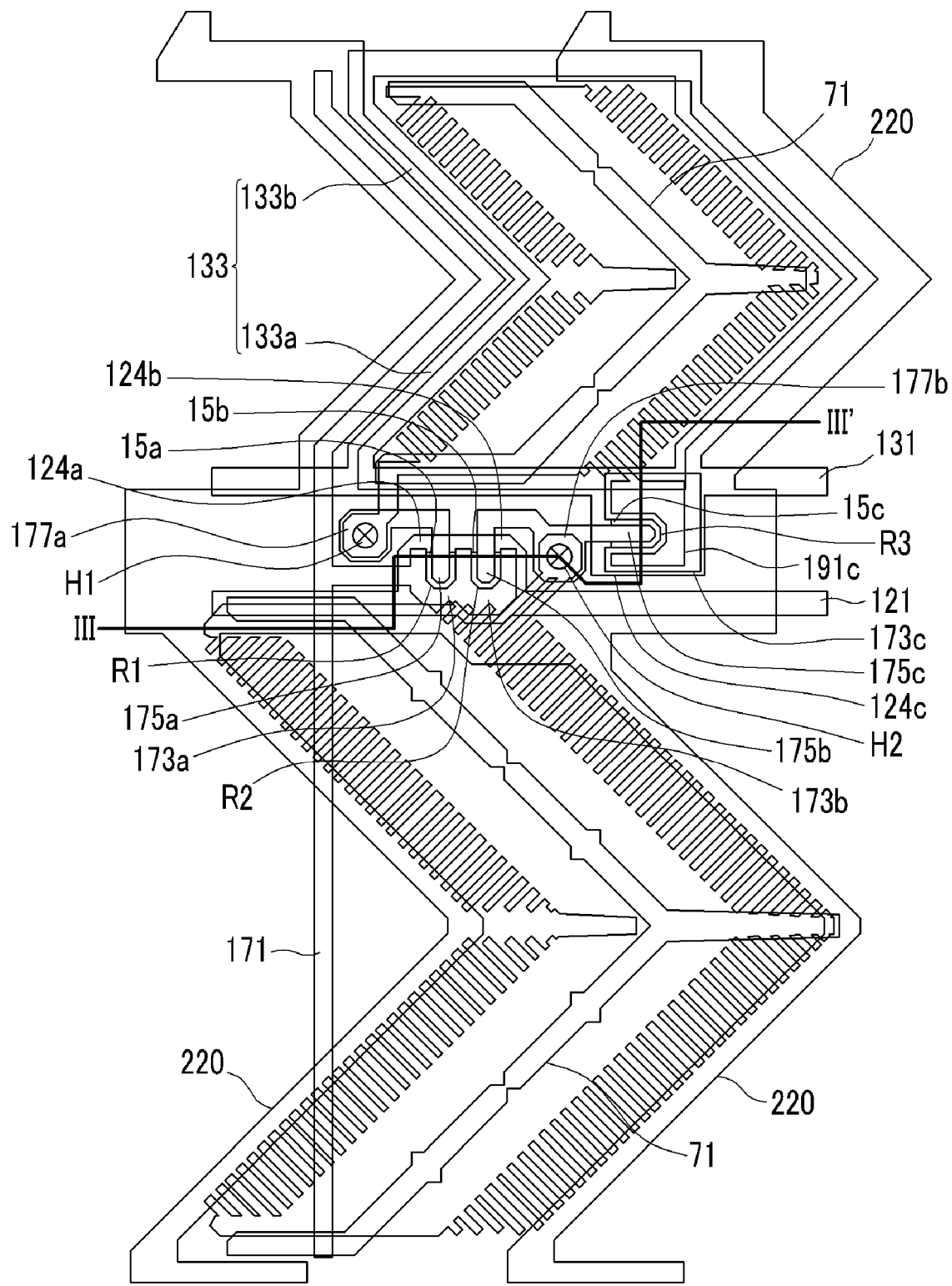
FIG. 18 is a top plan view of a liquid crystal display according to exemplary embodiments of the present invention.

FIG. 18 is a top plan view of a liquid crystal display according to exemplary embodiments of the present invention. The description overlapping the liquid crystal display of FIG. 1 and FIG. 2 may be omitted in order to avoid unnecessarily obscuring the invention.

An expansion 191c of the first pixel electrode connected to the first pixel electrode 191a may further be included. The expansion 191c of the first pixel electrode may be connected to one end of the first pixel electrode 191a. For example, it may be connected to the side near the third transistor Tr3 in the first pixel electrode 191a. The plane shape of the expansion 191c of the first pixel electrode may be similar to the plane shape of the third source electrode 173c. The expansion 191c of the first pixel electrode may be disposed with the same layer of the first pixel electrode 191a. The expansion 191c of the first pixel electrode and the first pixel electrode 191a may be simultaneously formed in the same patterning process. The expansion 191c of the first pixel electrode may be applied with the same data voltage as the data voltage applied with the first pixel electrode 191a. The expansion 191c of the first pixel electrode may form an upper capacitor Cup along with the third source electrode 173c. The branch of the first pixel electrode 191a may overlap the storage electrode 133.

The upper display panel 2 includes a light blocking member 220 and a common electrode 270 including a cutout 71. Also, a liquid crystal layer 3 is disposed between the lower display panel 1 and the upper display panel 2.

The light blocking member 220 for preventing light leakage is formed on the substrate 110. The light blocking member 220 overlaps the branch of the second pixel electrode 191b.

A common electrode 270 is formed on a substrate 210 and the light blocking member 220. The common electrode 270 may be made of a transparent conductor such as indium tin oxide (ITO) and indium zinc oxide (IZO).

The common electrode 270 includes a plurality of cutouts 71. Each cutout 71 includes a notch of a triangle shape. The notch may have a quadrangular, trapezoidal, or semi-circular shape, and may be convex or concave. The notch determines the arrangement direction of liquid crystal molecules disposed on the region boundary corresponding to the cutout.

Alignment layers (not shown) may be positioned on the display panels 1 and 2, and may be vertical alignment layers.

The liquid crystal layer 3 may have negative dielectric anisotropy, and the liquid crystal molecules may be oriented such that the major axes thereof are substantially perpendicular to the surfaces of the two display panels 100 and 200 when no electric field is applied.

Figure 3:
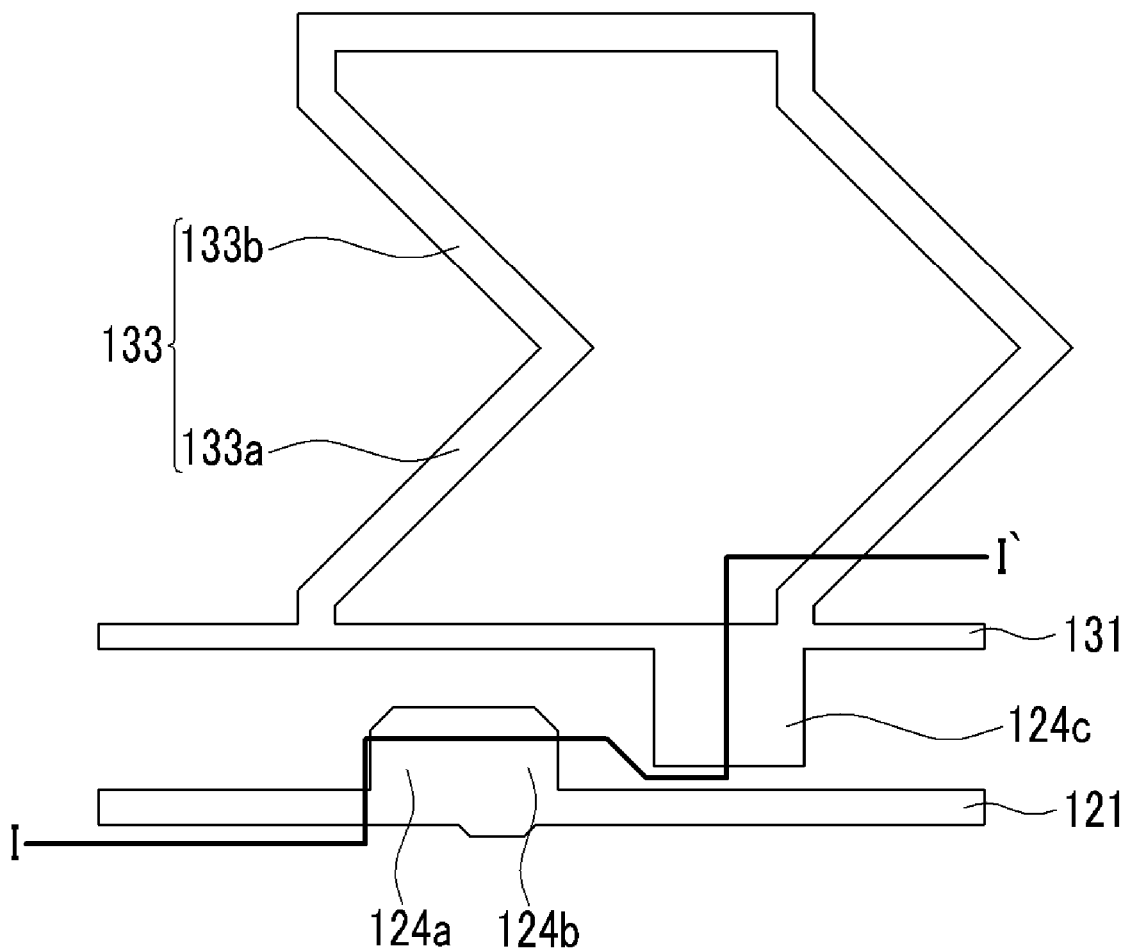
FIG. 3, FIG. 5, and FIG. 7 are top plan views showing a manufacturing method of the liquid crystal display shown in FIG. 1 and FIG. 2.
Figure 4:
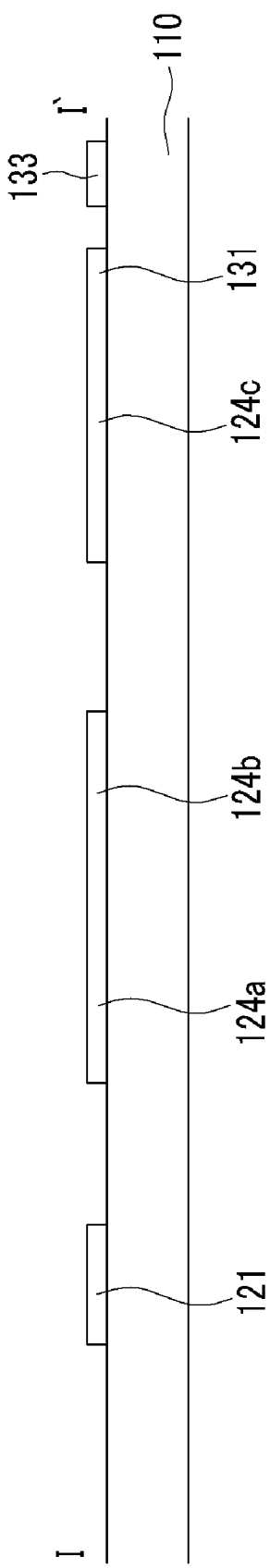
FIG. 4, FIG. 6, and FIG. 8 are cross-sectional views taken along the line I-I' of FIG. 3, FIG. 5, and FIG. 7, respectively.
Figure 5:
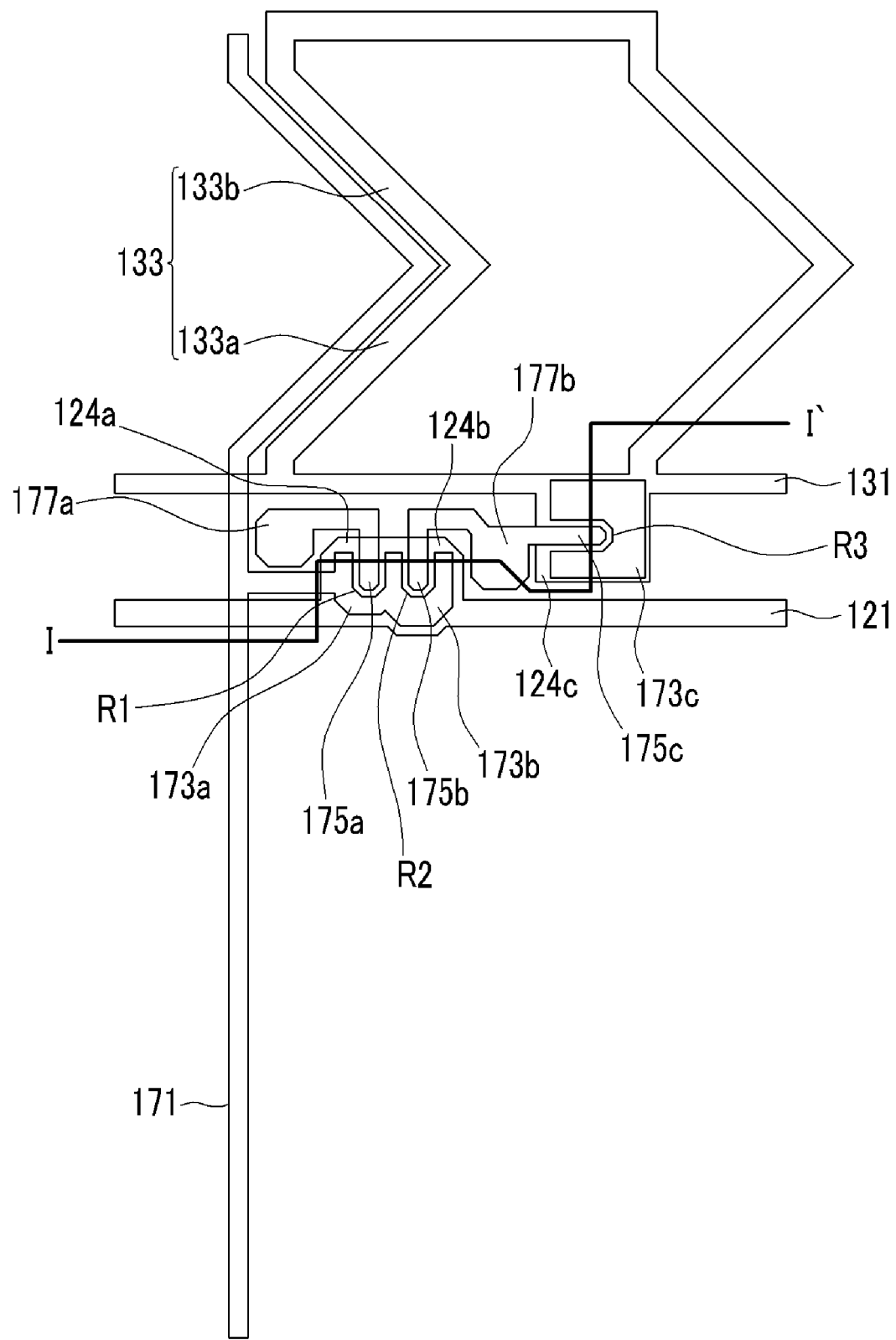
Figure 6:
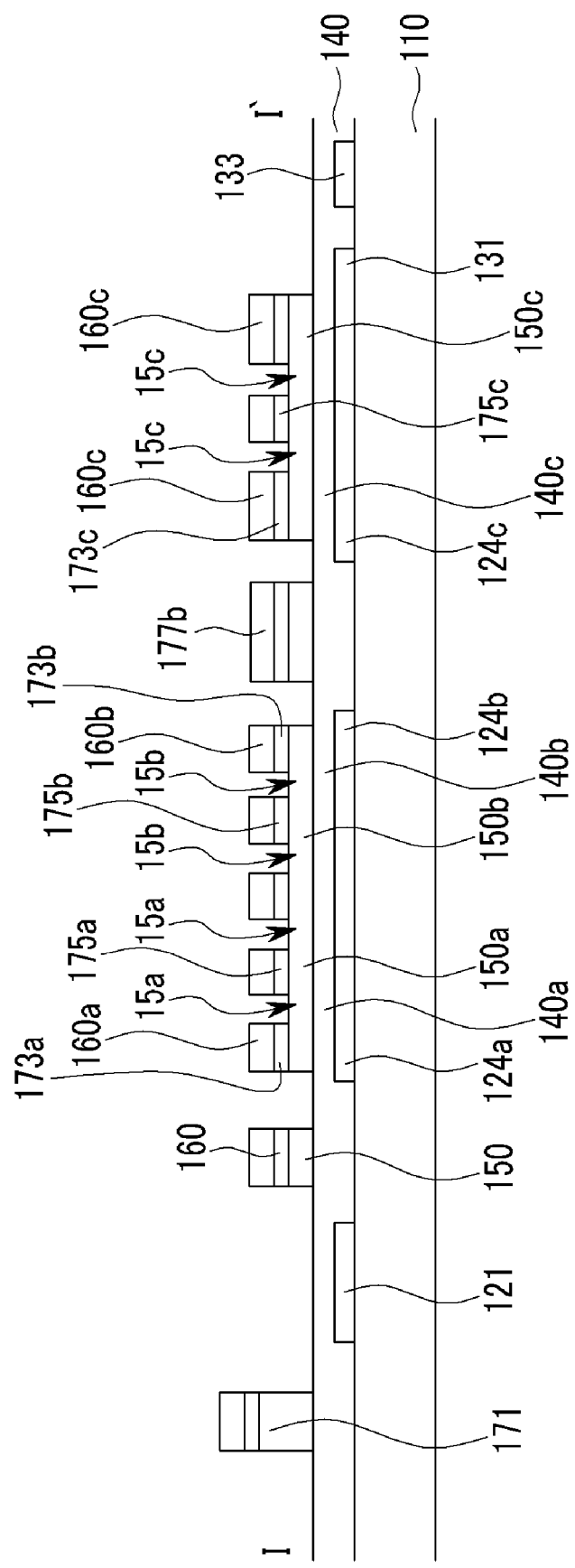
Figure 7:
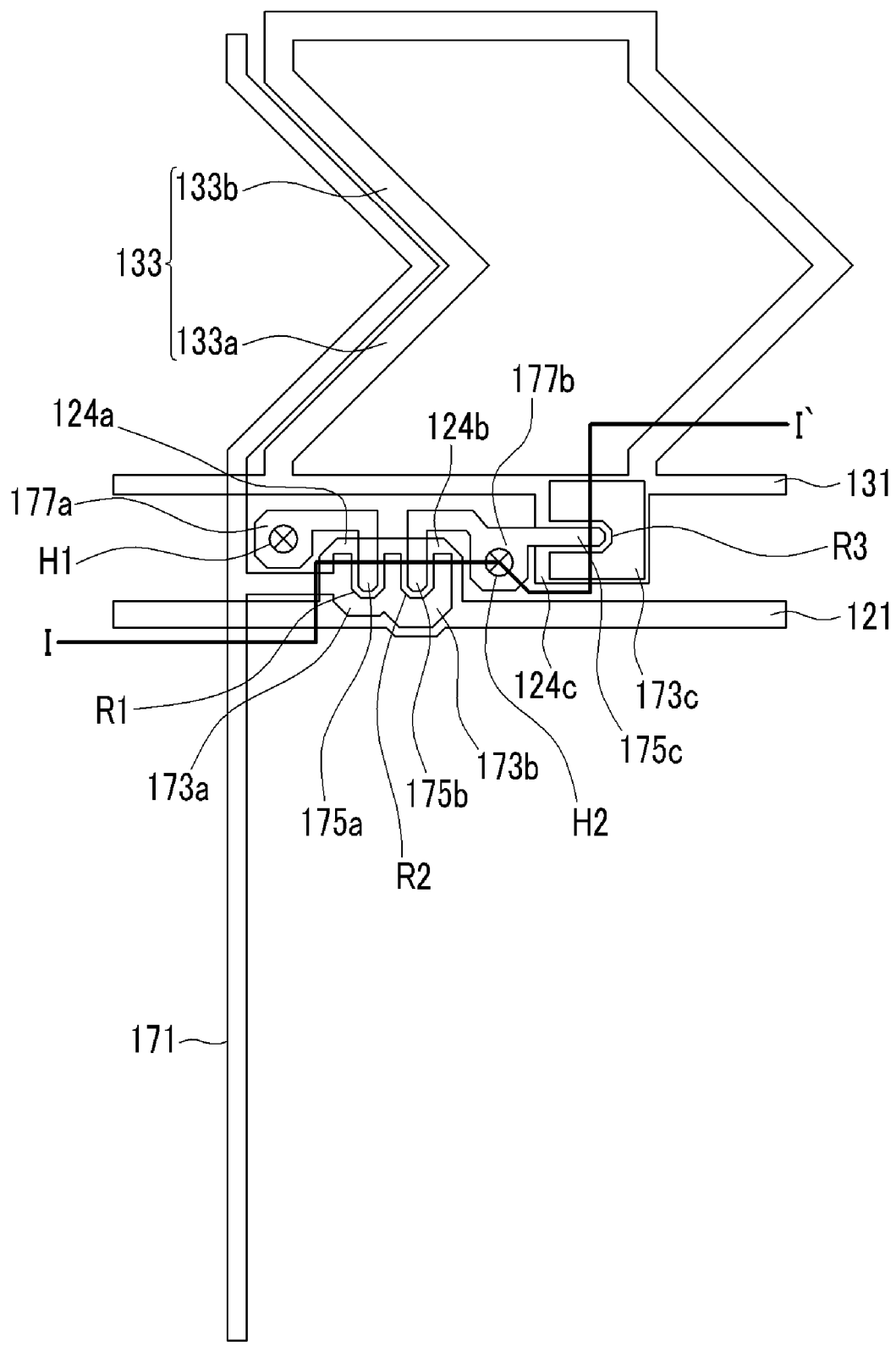
Figure 8:
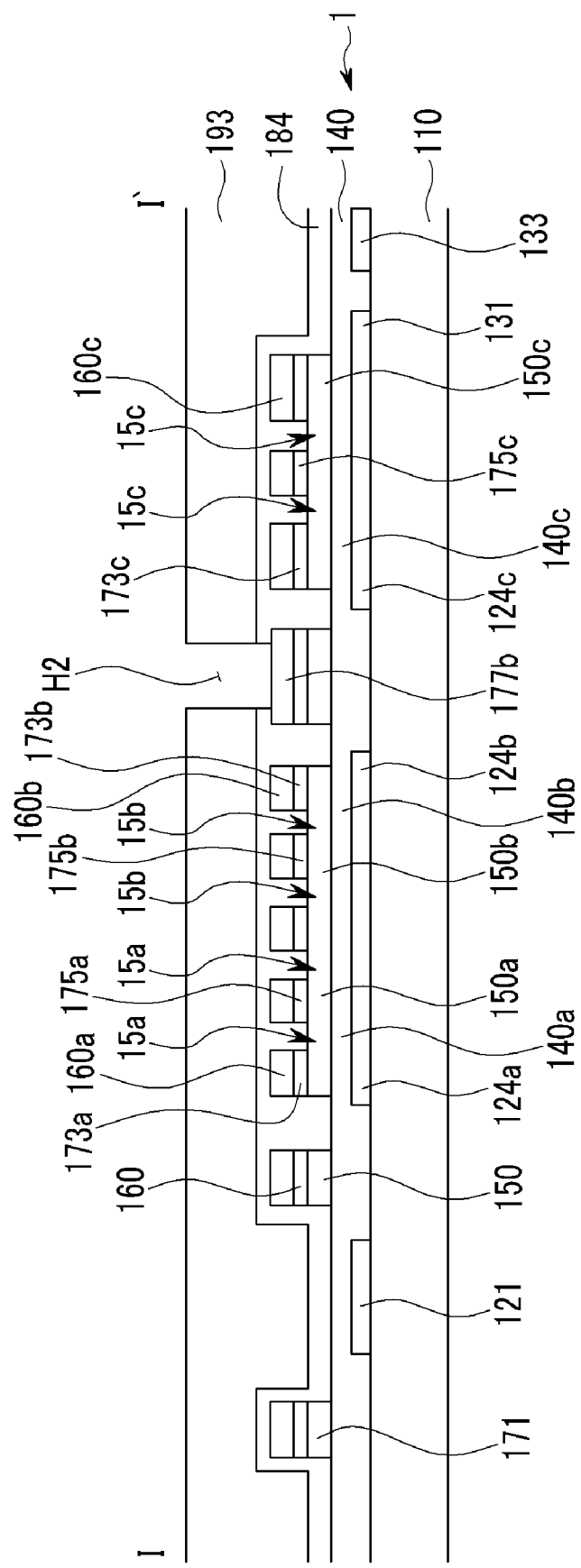

FIG. 3, FIG. 5, and FIG. 7 are top plan views showing a manufacturing method of the liquid crystal display shown in FIG. 1 and FIG. 2. FIG. 4, FIG. 6, and FIG. 8 are cross-sectional views taken along the line I-I' of FIG. 3, FIG. 5 and FIG. 7, respectively.

Referring to FIG. 3 and FIG. 4, a conductive layer (not shown) is formed on a substrate 110. The conductive layer is patterned through a first etching process to form the gate line 121, the first gate electrode 124a, the second gate electrode 124b, the storage electrode line 131, the storage electrode 133, and the third gate electrode 124c.

Here, the one side of the storage electrode 133 may include the first portion 133a that is toward the inner portion of the pixel and is extended away from the gate line 121 and the second portion 133b that is connected to the first portion 133a and is extended away from the gate line 121 toward the outer portion of the pixel.

Also, the storage electrode 133 may have a closed-loop shape. In this example, the storage electrode 133 encloses the outer part of the first pixel electrode 191a thereby preventing light leakage.

Referring to FIG. 5 and FIG. 6, the insulating layer 140 covering the gate line 121, the first gate electrode 124a, the second gate electrode 124b, the storage electrode line 131, the storage electrode 133, and the third gate electrode 124c is formed on the substrate 110.

A semiconductor layer (not shown), an ohmic contact layer (not shown), and a conductive layer (not shown) are sequentially formed on the insulating layer 140. A mask is aligned on the conductive layer and the second etching process is executed.

The conductive layer is etched to form a conductive layer pattern (171, 173a, 173b, 173c, 175a, 175b, 175c, 177a, and 177b) including the data line 171, the first source electrode 173a, the second source electrode 173b, the third source electrode 173c, the first drain electrode 175a, the second drain electrode 175b, the third drain electrode 175c, the first contact region 177a, and the second contact region 177b.

The ohmic contact layer is etched to form an ohmic contact layer pattern 160 under the conductive layer pattern (171, 173a, 173b, 173c, 175a, 175b, 175c, 177a, and 177b). The ohmic contact layer pattern 160 has substantially the same shape as the conductive layer pattern (171, 173a, 173b, 173c, 175a, 175b, 175c, 177a, and 177b).

The semiconductor layer is etched to form the semiconductor layer pattern 150 under the ohmic contact layer pattern 160. The semiconductor layer pattern 150 has a different shape from the conductive layer pattern (171, 173a, 173b, 173c, 175a, 175b, 175c, 177a, and 177b), and the ohmic contact layer pattern 160.

The semiconductor layer pattern 150 has a structure such that the first portion 15a between the first source electrode 173a and the first drain electrode 175a, the second portion 15b between the second source electrode 173b and the second drain electrode 175b, and the third portion 15c between the third source electrode 173c and the third drain electrode 175c are not removed and are maintained through the second etching process.

When the thickness of the mask used in the second etching process is controlled, the first to third portions 15a, 15b, and 15c of the semiconductor layer pattern 150 may be maintained.

In some examples, when the thickness of the portions that are disposed on the first to the third portions 15a, 15b, and 15c among the mask is lower, the portions of the conductive layer and the ohmic contact layer that are disposed on the first to third portions 15a, 15b, and 15c of the semiconductor layer pattern 150 are removed, however the first to third portions 15a, 15b, and 15c of the semiconductor layer pattern 150 are not etched such that the first to third portions 15a, 15b, and 15c of the semiconductor layer pattern 150 may be maintained.

Referring to FIG. 7 and FIG. 8, the structure of FIG. 6 and FIG. 8 is formed, and then the passivation layer 184 is deposited. The insulating layer 193 is formed on the passivation layer 184. According to exemplary embodiments of the present invention, the insulating layer 193 may be formed after forming a color filter (not shown) on the passivation layer 184.

The insulating layer 193 and the passivation layer 184 are patterned through the third etching process to form the first contact hole H1 and the second contact hole H2 respectively exposing the first contact region 177a and the second contact region 177b.

Referring to FIG. 1 and FIG. 2, a conductive layer (not shown) filling the first contact hole H1 and the second contact hole H2 is formed on the insulating layer 193.

The conductive layer is patterned through the fourth etching process to form the first pixel electrode 191a connected to the first contact region 177a through the first contact hole H1, and the second pixel electrode 191b connected to the second contact region 177b through the second contact hole H2. Accordingly, the lower display panel 1 of the liquid crystal display is formed.

Referring to FIG. 2, the upper display panel 2 having the common electrode 270 is provided. Next, the liquid crystal layer 3 is formed between the lower display panel 1 and the upper display panel 2 to complete the liquid crystal display.

The liquid crystal displays of FIG. 1 and FIG. 2, and FIG. 15 and FIG. 16 are examples having the circuit of the liquid crystal display of FIG. 9, FIG. 10, FIG. 11 and FIG. 12. Accordingly, if the connection relationship shown in the circuit of the liquid crystal display of FIG. 9, FIG. 10, FIG. 11 and FIG. 12 is provided, the arrangement of the liquid crystal display may variously be changed.

Referring to FIG. 1 and FIG. 2 and FIG. 15 and FIG. 16, the first gate electrode 124a, the first gate insulating layer 140a, the first semiconductor pattern 150a, the first ohmic contact pattern 160a, the first source electrode 173a, and the first drain electrode 175a form the first transistor Tr1.

The second gate electrode 124b, the second gate insulating layer 140b, the second semiconductor pattern 150b, the second ohmic contact pattern 160b, the second source electrode 173b, and the second drain electrode 175b form the second transistor Tr2.

The first gate electrode 124a and the second gate electrode 124b are connected to the gate line 121. The first source electrode 173a and the second source electrode are connected to the data line 171. Accordingly, the first transistor Tr1 and the second transistor Tr2 are simultaneously turned on or off.

The third gate electrode 124c, the third gate insulating layer 140c, the third semiconductor pattern 150c, the third ohmic contact pattern 160c, the third source electrode 173c, and the third drain electrode 175c form the third transistor Tr3. Here, the third gate electrode 124c is connected to the storage electrode line 131. The storage electrode line 131 may be applied a voltage of a predetermined magnitude independently of the common electrode 270. That is, the storage electrode line 131 may be used to apply the signal to the third gate electrode 124c, thereby the aperture ratio and the transmittance of the liquid crystal display may not decrease. The voltage to be applied to the storage electrode line 131 or the common electrode 270 may be a value by considering a kick-back voltage. For example, when the range of the driving voltage of the liquid crystal display is 15V and the kick-back voltage is 1V, the reference potential may be 15/2V, and the driving voltage may be swung with a magnitude of about 4.5V to 8.5V. Also, for the driving of a high speed such as about 240 Hz or about 480 Hz, a pre-charge driving method in which a current gate-on voltage and a previous gate-on voltage overlap each other and a driving method in which a current gate-on voltage and a previous gate-on voltage do not overlap may be applied, and the latter driving method may further improve the display quality of the display device than the former driving method.

Here, the third gate electrode 124c, the third gate insulating layer 140, and the third source electrode 173c form a lower capacitor Cdown. The lower capacitor Cdown may include the third semiconductor pattern 150c and the third ohmic contact pattern 160c that are sequentially positioned between the third gate insulating layer 140 and the third source electrode 173c.

The first pixel electrode 191a, the liquid crystal layer 3, and the common electrode 270 form a liquid crystal capacitor Clc, and the second pixel electrode 191b, the liquid crystal layer 3, and the common electrode 270 form the liquid crystal capacitor Clc.

Figure 9:
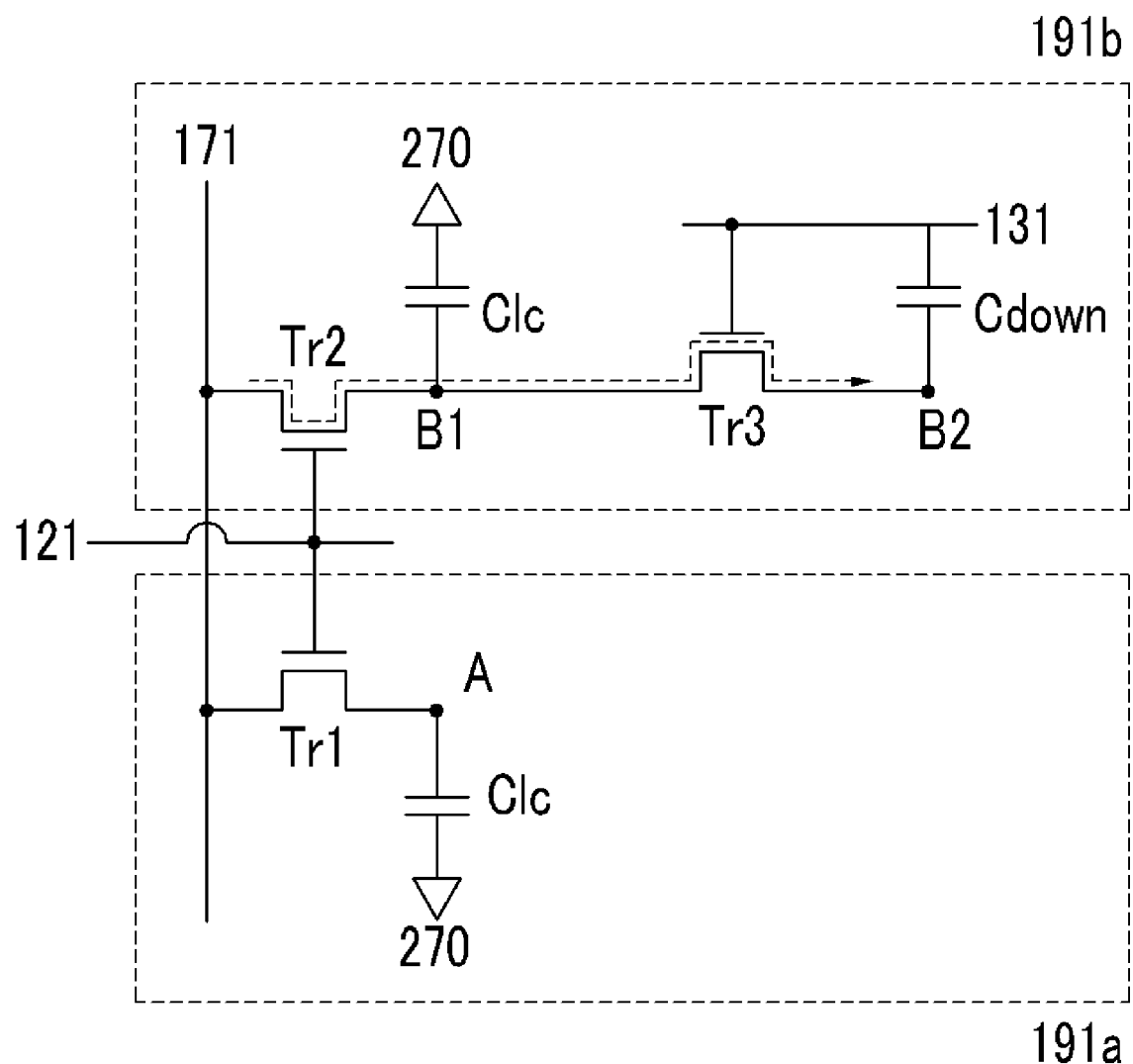
FIG. 9 is a circuit diagram of a liquid crystal display captured at a positive data voltage is applied through a data line.
Figure 10:
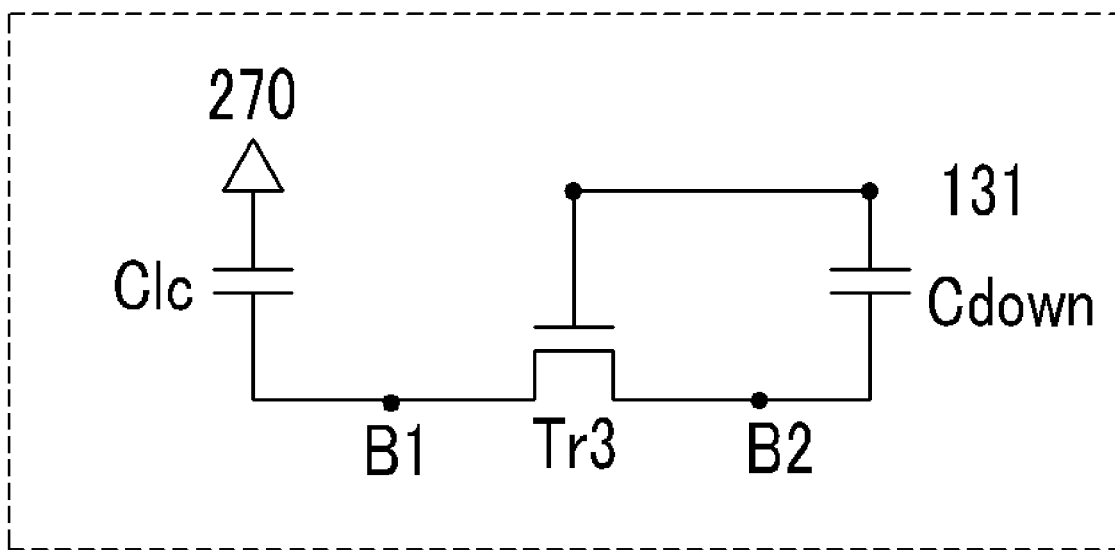
FIG. 10 is a circuit diagram of a liquid crystal display captured at subsequent to applying a positive data voltage through a data line.
Figure 10:
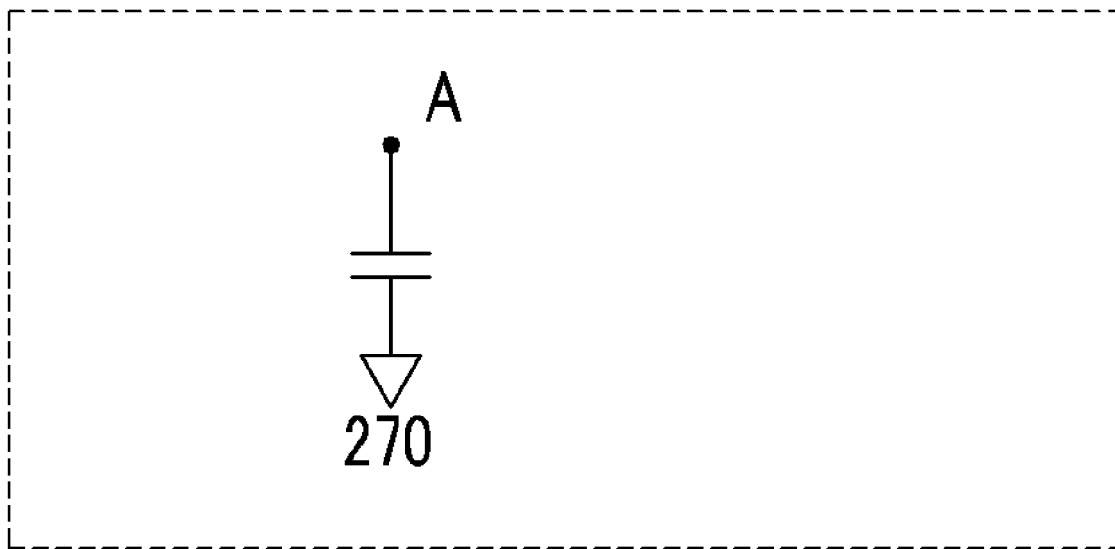

FIG. 9 is a circuit diagram of a liquid crystal display captured at a positive data voltage is applied through a data line, and FIG. 10 is a circuit of a liquid crystal display captured at subsequent to applying a positive data voltage through a data line.

Referring to FIG. 9, the voltage of the node B1 becomes a data voltage, and the voltage of the node A also becomes a data voltage. The voltage of the node B2 is a value by considering a charging ratio of the lower capacitor with reference to the data voltage, and the current flows in an arrow direction indicated by a dotted line. The charging ratio of the lower capacitor may appropriately be controlled by the width of the third transistor, the magnitude of the lower capacitor, and the magnitude of the voltage applied to the storage electrode line. The size of the third transistor Tr3 may be related to the gate-on time. For example, as the gate-on time is increased, the size of the third transistor Tr3 may be decreased. In contrast, as the gate-on time is decreased, the size of the third transistor Tr3 may be increased. Also, the size of the third transistor Tr3 may be larger than the minimum size of the transistor, and may be smaller than the size of the second transistor Tr2.

Referring to FIG. 10, after applying the positive data voltage, voltage distribution occurs based on the magnitude of the liquid crystal capacitor Clc and the lower capacitor Cdown such that a voltage of the node B1 is equal to a voltage of the node B2 and a voltage of the node A is maintained at the data voltage as it is. Accordingly, the magnitude of the voltage applied to the first pixel electrode 191a is larger than the magnitude of the voltage applied to the second pixel electrode 191b.

Accordingly, when the positive voltage is applied, the region occupied by the first pixel electrode 191a is a high region, and the region occupied with the second pixel electrode 191b is a low region.

Figure 11:
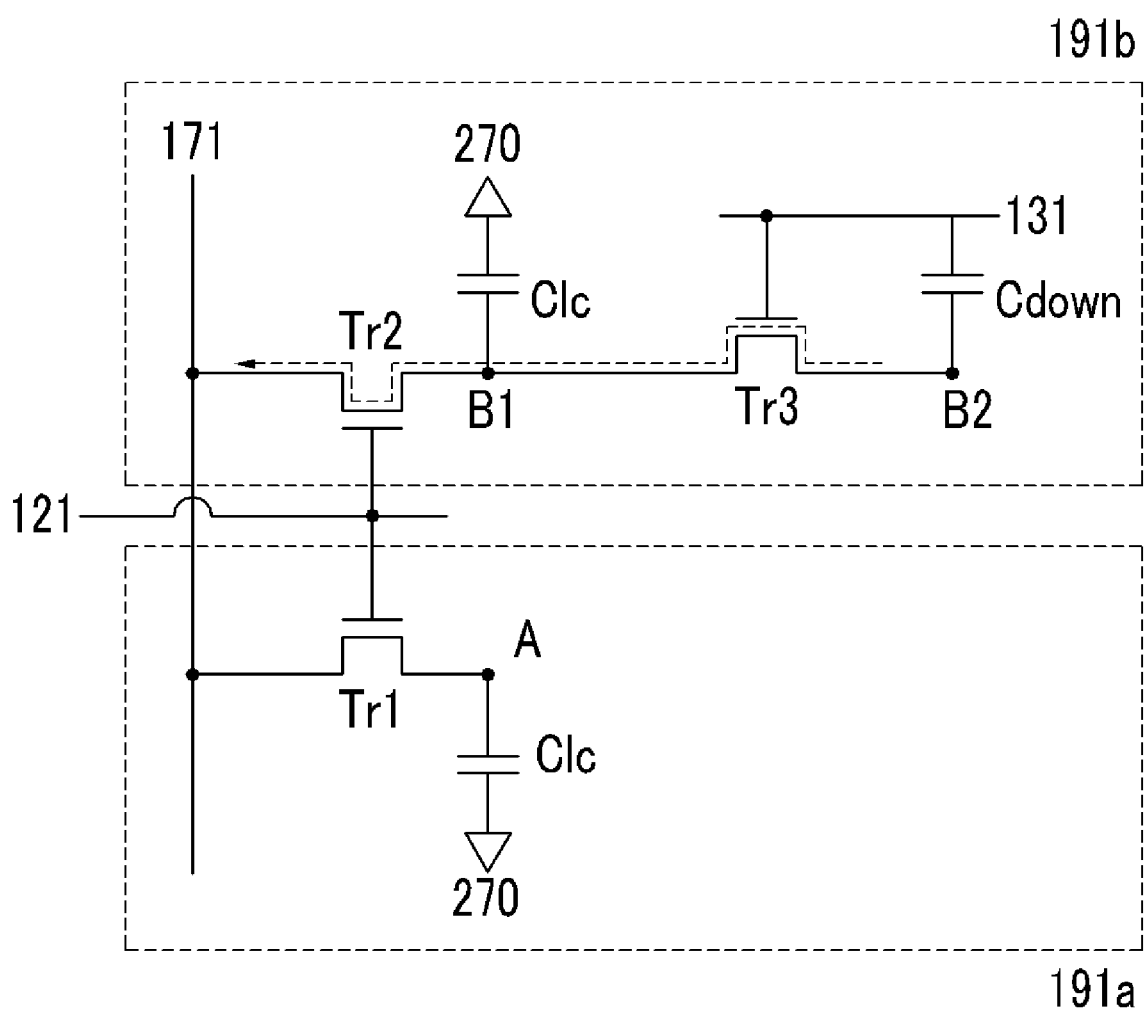
FIG. 11 is a circuit diagram of liquid crystal display captured at a negative data voltage is applied through a data line.
Figure 12:
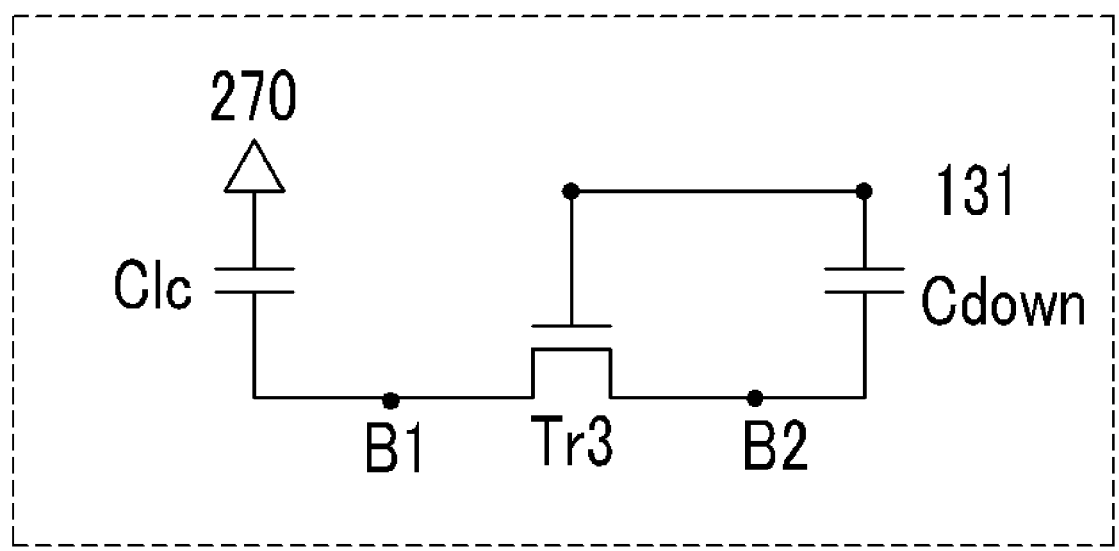
FIG. 12 is a circuit diagram of a liquid crystal display captured at subsequent to applying a negative data voltage through a data line.
Figure 12:
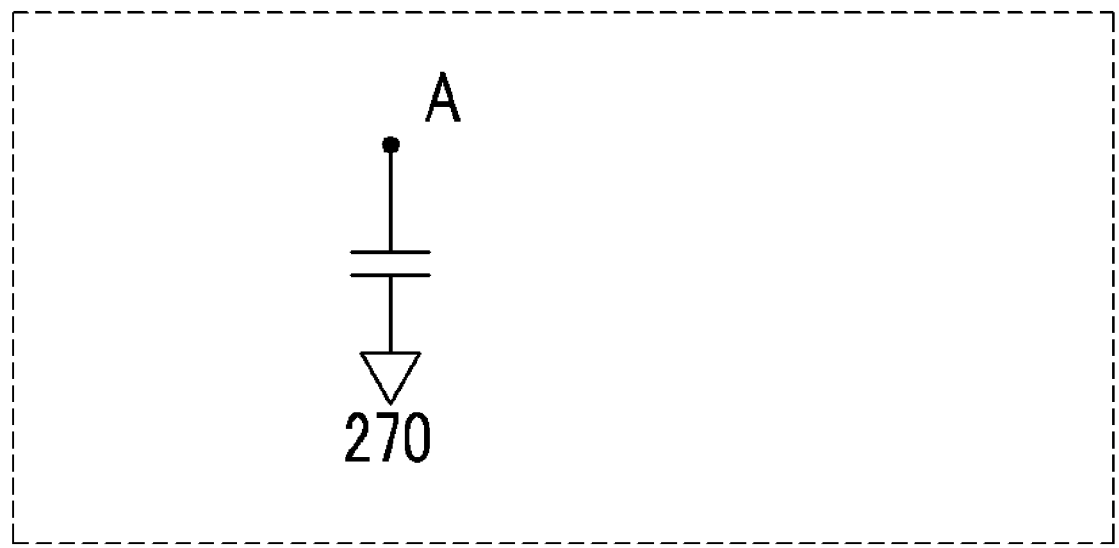

FIG. 11 is a circuit of liquid crystal display captured at a negative data voltage is applied through a data line, and FIG. 12 is a circuit of a liquid crystal display captured at subsequent to applying a negative data voltage through a data line.

Referring to FIG. 11, the voltage of the node B1 becomes a data voltage, and the voltage of the node A also becomes the data voltage. The voltage of the node B2 is the value by considering the charging ratio of the lower capacitor with reference to the data voltage, and the current flows in an arrow direction indicated by a dotted line. The charging ratio of the lower capacitor may appropriately be controlled by the width of the third transistor, the magnitude of the lower capacitor, and the magnitude of the voltage applied to the storage electrode line.

Referring to FIG. 12, after applying the negative data voltage, voltage distribution occurs based on the magnitude of the liquid crystal capacitor Clc and the lower capacitor Cdown such that a voltage of the node B1 is equal to a voltage of the node B2 and a voltage of the node A is maintained at the data voltage as it is. Accordingly, the magnitude of the voltage applied to the first pixel electrode 191a is larger than the magnitude of the voltage applied to the second pixel electrode 191b.

Accordingly, when the negative voltage is applied, the region occupied with the first pixel electrode 191a is the high region, and the region occupied with the second pixel electrode 191b is the low region.

Figure 17:
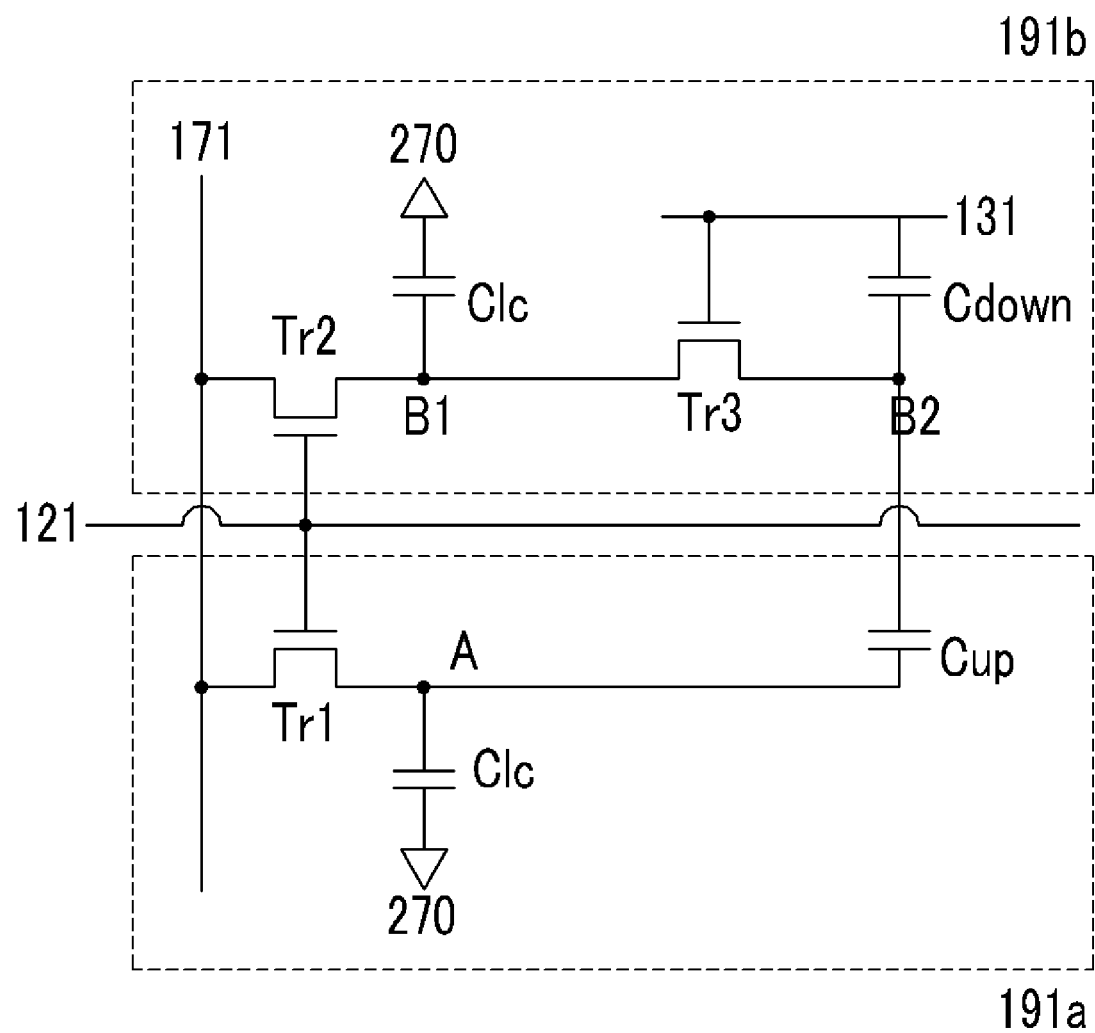
FIG. 17 is a circuit diagram of a liquid crystal display according to exemplary embodiments of the present invention.

FIG. 17 is a circuit diagram of a liquid crystal display according to exemplary embodiments of the present invention. The description overlapping with the circuit diagram of FIG. 9, FIG. 10, FIG. 11 and FIG. 12 is omitted in order to avoid unnecessarily obscuring the invention.

Figure 19:
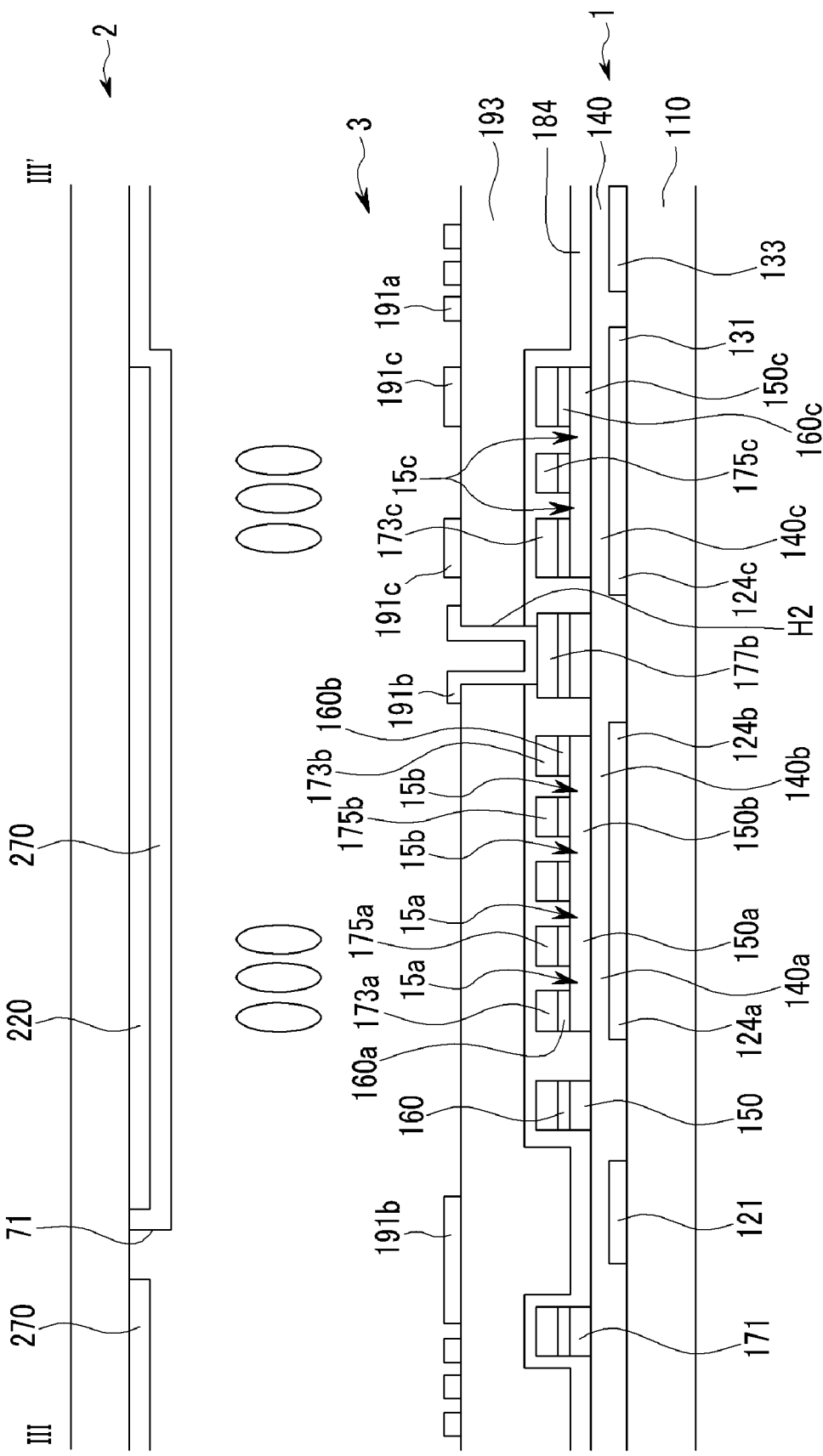
FIG. 19 is a cross-sectional view taken along the line III-III' of FIG. 18.

The liquid crystal display of FIG. 18 and FIG. 19 is exemplarily representing the circuit of the liquid crystal display of FIG. 17. Accordingly, if the connection relationship shown in the circuit of the liquid crystal display of FIG. 17 is provided, the arrangement of the liquid crystal display may be variously changed.

The circuit diagram of FIG. 17 further includes the upper capacitor Cup connected between the node B2 and the node A to the circuit diagram of FIG. 9, FIG. 10, FIG. 11 and FIG. 12. Through the connection of the upper capacitor Cup, the magnitude of the voltage applied to the first pixel electrode 191a may further be increased. As a result, the difference between the magnitude of the voltage applied to the first pixel electrode 191a and the magnitude of the voltage applied to the second pixel electrode 191b may further be increased. Accordingly, the luminance difference between the high region and the low region is further increased such that the visibility of the liquid crystal display may further be improved. Also, the transmittance of the liquid crystal display may further be improved.

The charging voltage of the first liquid crystal capacitor Clca and the second liquid crystal capacitor Clcb may be changed by the upper capacitor Cup and the lower capacitor Cdown. That is, the charges of the second pixel electrode 191b connected to the output terminal of the second switching element Tr2 flow into the upper capacitor Cup such that the voltage of the second liquid crystal capacitor Clcb may be decreased. Also, the charges of the upper capacitor Cup connected to the output terminal of the third switching element Tr3 flow into the lower capacitor Cdown such that the voltage of the first liquid crystal capacitor Clca may be increased. Accordingly, the charging voltage of the second liquid crystal capacitor Clcb may be decreased by the upper capacitor Cup, and the charging voltage of the first liquid crystal capacitor Clca may be increased by the lower capacitor Cdown such that the difference between the charging voltages of the first liquid crystal capacitor Clca and the second liquid crystal capacitor Clcb may be increased.

Through this operation, if the voltage is charged to the first liquid crystal capacitor Clca and the second liquid crystal capacitor Clcb, the electric field is formed to the liquid crystal layer 3. Thus, the liquid crystal molecules of the liquid crystal layer 3 change directions in response to the electric field so that the major axes thereof become perpendicular to the direction of the electric field, and the degree of changing the polarization of the light that is incident to the liquid crystal layer 3 is changed according to the inclination degree of the liquid crystal molecules. The polarization change appears as a transmittance change by a polarizer, and accordingly, the liquid crystal display displays the images.

A charging voltage of the first liquid crystal capacitor Clca and a charging voltage of the second liquid crystal capacitor Clcb may be different such the inclination angle of the liquid crystal molecules may be different in the first pixel electrode 191a and the second pixel electrode 191b, and the luminance of the pixel corresponding to the first pixel electrode 191a and the second pixel electrode 191b may be different. Accordingly, if the charging voltage of the first liquid crystal capacitor Clca and the charging voltage of the second liquid crystal capacitor Clcb are appropriately controlled, an image seen in the side may be closest to an image seen in the front such that the side visibility may be improved.

On the other hand, edges of the minute branches distorts the electric field thereby making the horizontal component perpendicular to the edges of the minute branches, and the inclination direction of the liquid crystal molecules may be determined based on the horizontal component. Here, the liquid crystal molecules may be inclined in the direction parallel to the length direction of the minute branches. Accordingly, the liquid crystal molecules disposed on the edge of the pixel electrode are quickly aligned in the direction of the domain formed by the cutout such that the response speed of the liquid crystal display may be improved.

In exemplary embodiments of the present invention, the length direction in which the minute branches 195 of one pixel extend are all four directions such that the directions that the liquid crystal molecules are inclined may be all four directions. As described above, the reference viewing angle of the liquid crystal display may be increased by varying the inclination direction of the liquid crystal molecules.

In exemplary embodiments of the present invention, the liquid crystal display of FIG. 1 through FIG. 19 may be modified to a 3D display by way of configurations. The 3D display may be categorized as stereoscopic method viewing typically using a glass such as a shutter glass and a polarized glass, and auto-stereoscopic method in which a lenticular lens or a parallax barrier is disposed to the display device without the glass.

Figure 20:
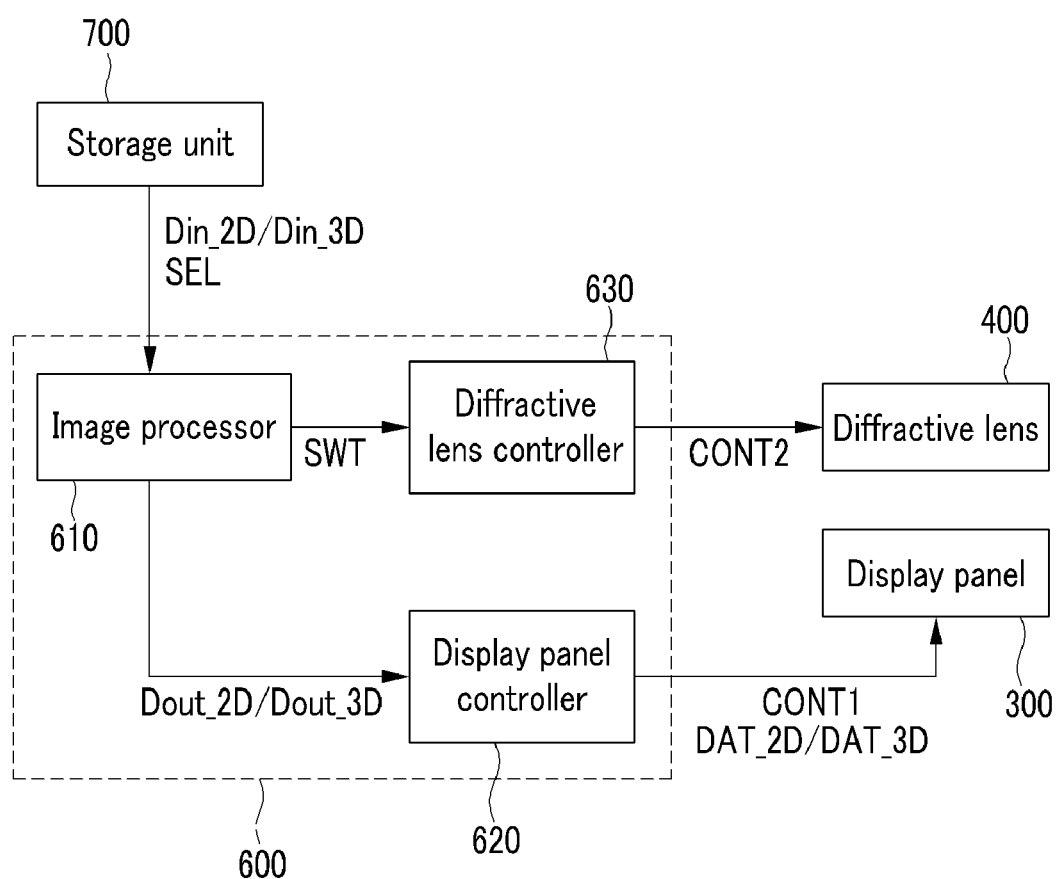
FIG. 20 is a block diagram of a driving method of an image display device according to exemplary embodiments of the present invention.

FIG. 20 is a block diagram of a driving method of a 3D display using a diffractive lens.

A diffractive lens 400 is capable of switching on/off to divide the vision field of the image displayed in the display panel 300 by using diffraction of the light. That is, the diffractive lens 400 refracts the image of the display panel 300 by using the diffraction of the light such that the image is formed at the corresponding vision field. The diffractive lens 400 is turned off when the display panel 300 is in the 2D mode and is turned on when it is in the 3D mode thereby having a function of dividing the vision field of the image of the display panel 300. Also, the diffractive lens 400 may be turned off when the display panel 300 is in the 3D mode, and it may be turned on when it is in the 2D mode.

The diffractive lens 400 may be realized through a Fresnel zone plate. The Fresnel zone plate is arranged in a radial manner like a general Fresnel zone, and means a device having a lens function using the diffraction of the light instead of the refraction of the light by using a plurality of concentric circles of which the interval is decreased from the center to the outer side.

A storing unit 700 outside the image display device stores the 2D image information and the 3D image information, and may receive selection information determining whether either one of the 2D image and the 3D image is displayed. The storing unit 700 input with the selection information outputs a 2D image signal Din__2D or a 3D image signal Din__3D, and a selection signal SEL to a controller 600 of the image display device according to the selection information. The kind of the image signal output from the storing unit 700 may be determined as one such that the selection signal SEL may be omitted.

An image processor 610 of the controller 600 receives the 2D image signal Din__2D or 3D image signal Din__3D, and the selection signal SEL, and appropriately processes them to transmit the processed 2D image signal Dout__2D or the processed 3D image signal Dout__3D to a display panel controller 620 and the switching signal Swt to a diffractive lens controller 630. The switching signal Swt is a signal for the on/off switching of the diffractive lens 400.

The diffractive lens controller 630 input with the switching signal Swt generates a diffractive lens control signal CONT2 to output it to the diffractive lens 400 of the image display device. The diffractive lens control signal CONT2 controls the switching on/off of the diffractive lens 400.

The display panel controller 620 receiving the processed 2D image signal Dout__2D or the processed 3D image signal Dout__3D generates the display panel control signal CONT1 and the 2D image data DAT__2D or the 3D image data DAT__3D to output them to the display panel 300. The display panel control signal CONT1 controls whether the display panel 300 is operated in the 3D mode or the 2D mode.

When operating in the 2D mode, the 2D image data DAT__2D is displayed, and when operating in the 3D mode, the 3D image data DAT__3D is displayed.

The diffractive lens 400 is switched on/off according to the diffractive lens control signal COT2. The diffractive lens 400 may be turned off when the display panel 300 is in the 2D mode and may be turned on when it is in the 3D mode, and contrary to this, it may be turned off when the display panel 300 is in the 3D mode and may be turned on when it is in the 2D mode. This may be determined according to the kind of diffractive lens 400.

Figure 13:
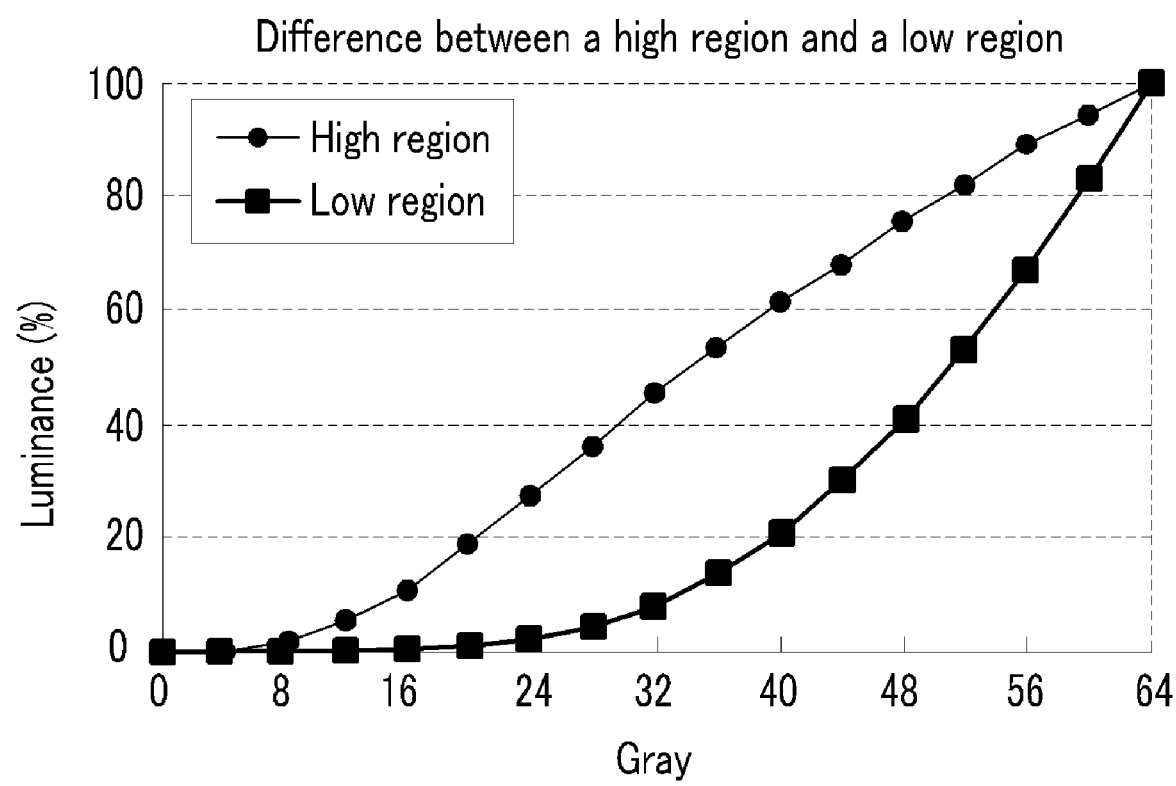
FIG. 13 is a graph showing a difference of a luminance between a high region including the first pixel electrode and a low region including the second pixel electrode of the liquid crystal display shown in FIG. 1 and FIG. 2.

FIG. 13 is a graph depicting a simulation result showing a difference of luminance between a high region including the first pixel electrode and a low region including the second pixel electrode in the liquid crystal display shown in FIG. 1 and FIG. 2.

Referring to FIG. 13, it is contemplated that the luminance difference between the high region and the low region is large at the middle gray of about 24 to about 40. When the luminance difference is large at the middle gray, the visibility may be improved such that the liquid crystal display may have the excellent visibility.

Figure 14:
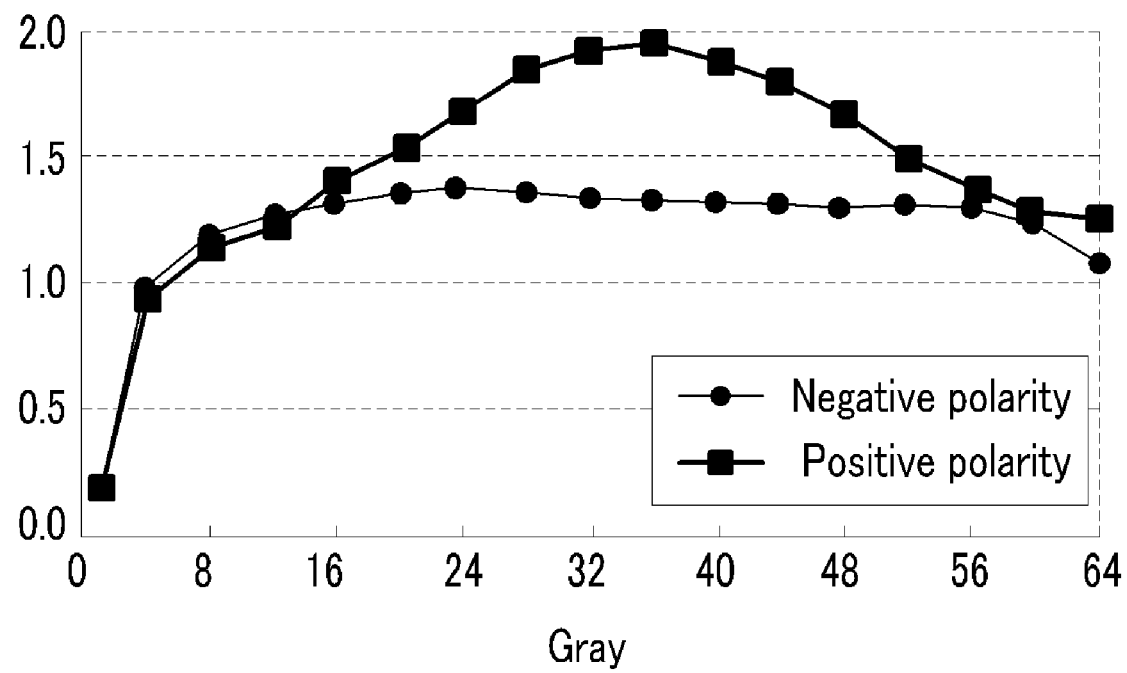
FIG. 14 is a graph showing a voltage difference between the first pixel electrode of the high region and the second pixel electrode of the low region of the liquid crystal display shown in FIG. 1 and FIG. 2 when applying the positive voltage and the negative voltage.

FIG. 14 is a graph of a simulation result showing a voltage difference between the first pixel electrode of the high region and the second pixel electrode of the low region in the liquid crystal display shown in FIG. 1 and FIG. 2 when applying the positive voltage and the negative voltage.

Referring to FIG. 14, the voltage difference is very low at about 1.0 to about 1.3 at the maximum gray of about 64. When the voltage difference is low at the maximum gray, the transmittance is increased such that the liquid crystal display has high and excellent transmittance.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display panel comprising:
a gate line;
a data line intersecting the gate line;
a first transistor connected to the gate line and the data line;
a second transistor connected to the gate line and the data line;
a storage electrode line spaced apart from the gate line;
a third transistor connected to the storage electrode line and the second transistor;
a first pixel electrode connected to the first transistor; and
a second pixel electrode connected to the second transistor and the third transistor, wherein the third transistor is connected to a first capacitor which comprises a first terminal and a second terminal, wherein the first terminal of the first capacitor is connected to a gate electrode of the third transistor, and the second terminal of the first capacitor is connected to a source electrode of the third transistor.

2. The display panel of claim 1, wherein
a gate electrode of the first transistor and a gate electrode of the second transistor are connected to the gate line.

3. The display panel of claim 1, wherein
the gate electrode of the third transistor is connected to the storage electrode line.

4. The display panel of claim 3, wherein
the gate electrode of the third transistor is integrally formed with the storage electrode line.

5. The display panel of claim 4, wherein
the gate electrode of the third transistor has a portion comprising a wide width of the storage electrode line.

6. The display panel of claim 3, wherein
the third transistor is connected to a second capacitor which comprises a first terminal and a second terminal, wherein the first terminal of the second capacitor is connected to the first pixel electrode, and the second terminal of the second capacitor is connected to the source electrode of the third transistor.

7. The display panel of claim 6, wherein
the source electrode of the third transistor comprises a first side comprising a concave recess, and the drain electrode of the third transistor is spaced apart from the source electrode of the third transistor and disposed in the concave recess.

8. The display panel of claim 7, wherein
the source electrode of the third transistor comprises a second side having a shape corresponding to an outer part of the gate electrode of the third transistor.

9. The display panel of claim 1, wherein
the first transistor comprises a first gate electrode connected to the gate line, a first source electrode connected to the data line, and a first drain electrode spaced apart from the first source electrode,
the second transistor comprises a second gate electrode connected to the gate line, a second source electrode connected to the data line, and a second drain electrode separated from the second source electrode,
the third transistor comprises a third gate electrode connected to the storage electrode line, a third drain electrode connected to the second drain electrode, and a third source electrode spaced apart from the third drain electrode,
wherein the first pixel electrode is connected to the first drain electrode, and
wherein the second pixel electrode is connected to the second drain electrode and the third drain electrode.

10. The display panel of claim 9, wherein
a first side of the first source electrode comprises a first concave recess, a first side of the second source electrode comprises a second concave recess, and a first side of the third source electrode comprises a third concave recess, and
the first drain electrode is disposed in the first recess while maintaining an interval with the first source electrode, the second drain electrode is disposed in the second recess while maintaining an interval with the second source electrode, and the third drain electrode is disposed in the third recess while maintaining an interval with the third source electrode.

11. The display panel of claim 10, wherein
the first source electrode and the second source electrode are integrally formed with each other.

12. The display panel of claim 10, wherein
the third source electrode has the second side having a shape corresponding to an outer part of the third gate electrode.

13. The display panel of claim 9, wherein
the third transistor is connected to a second capacitor comprising a first terminal and a second terminal, the first terminal of the second capacitor being connected to the first pixel electrode, and the second terminal of the second capacitor being connected to the third source electrode.

14. The display panel of claim 9, wherein
the second drain electrode and the third drain electrode are integrally formed with each other, and the second drain electrode and the third drain electrode are connected to the second pixel electrode through a contact hole.

15. A display device comprising:
a lower display panel comprising a gate line, a data line intersecting the gate line, a first transistor connected to the gate line and the data line, a second transistor connected to the gate line and the data line, a storage electrode line spaced apart from the gate line, a third transistor connected to the storage electrode line and the second transistor, a first pixel electrode connected to the first transistor, and a second pixel electrode connected to the second transistor and the third transistor;
a liquid crystal layer disposed on the lower display panel; and
an upper display panel disposed on the liquid crystal layer, the upper display panel comprising a common electrode, wherein
the third transistor is connected to a first capacitor comprising a first terminal and a second terminal, wherein the first terminal of the first capacitor is connected to a gate electrode of the third transistor, and the second terminal of the first capacitor is connected to a source electrode of the third transistor.

16. The device of claim 15, wherein
a gate electrode of the first transistor and a gate electrode of the second transistor are connected to the gate line, and the gate electrode of the third transistor is connected to the storage electrode line.

17. The device of claim 16, wherein
the third transistor is connected to a second capacitor comprising a first terminal and a second terminal, wherein the first terminal of the second capacitor is connected to the first pixel electrode, and the second terminal of the second capacitor is connected to the source electrode of the third transistor.

18. The device of claim 16, wherein
the source electrode of the third transistor has at least one side having a shape corresponding to an outer part of the gate electrode of the third transistor.

19. A method for providing a circuit layout for operating a display device, the method comprising:
disposing a gate line and a data line intersecting the gate line on a substrate;
disposing a first pixel electrode and a second pixel electrode on the substrate
forming a first transistor, a second transistor and a third transistor and each transistor comprising a gate electrode, a source electrode, and a drain electrode, the first transistor and the second transistor coupled to the gate line and the data line and the first pixel electrode and the second pixel electrode coupled to the respective transistors; and
forming a storage electrode line that is spaced apart from the gate line, wherein the third transistor being separated from the gate line is coupled to the storage electrode line and the second transistor, and wherein the first pixel electrode is coupled to the first transistor, and the second pixel electrode is coupled to the second transistor and the third transistor, wherein
the third transistor is connected to a first capacitor which comprises a first terminal and a second terminal, wherein the first terminal of the first capacitor is connected to the gate electrode of the third transistor, and the second terminal of the first capacitor is connected to the source electrode of the third transistor.

20. The method of claim 19, wherein
the gate electrode of the third transistor is integrally formed with the storage capacitor electrode line.

* * * * *